US008688619B1

(12) United States Patent
Ezick et al.

(10) Patent No.: US 8,688,619 B1
(45) Date of Patent: Apr. 1, 2014

(54) SYSTEMS, METHODS AND APPARATUS FOR DISTRIBUTED DECISION PROCESSING

(75) Inventors: James Ezick, Canonsburg, PA (US); Richard Lethin, New York, NY (US); Nicolas Vasilache, New York, NY (US)

(73) Assignee: Reservoir Labs, New York, NY (US)

( * ) Notice: Subject to any disclaimer, the term of this patent is extended or adjusted under 35 U.S.C. 154(b) by 853 days.

(21) Appl. No.: 12/719,750

(22) Filed: Mar. 8, 2010

Related U.S. Application Data

(60) Provisional application No. 61/158,665, filed on Mar. 9, 2009.

(51) Int. Cl.
*G06F 17/00* (2006.01)

(52) U.S. Cl.
USPC .......................................................... 706/57

(58) Field of Classification Search
None
See application file for complete search history.

(56) References Cited

U.S. PATENT DOCUMENTS

| | | | |
|---|---|---|---|
| 5,442,699 A | 8/1995 | Arnold et al. | |
| 5,742,814 A | 4/1998 | Balasa et al. | |
| 5,920,854 A | 7/1999 | Kirsch et al. | |
| 5,953,531 A | 9/1999 | Megiddo et al. | |
| 6,018,735 A | 1/2000 | Hunter | |
| 6,038,398 A | 3/2000 | Schooler | |
| 6,131,092 A | 10/2000 | Masand | |
| 6,279,113 B1 | 8/2001 | Vaidya | |
| 6,327,699 B1 | 12/2001 | Larus et al. | |
| 6,338,057 B1 | 1/2002 | Weeks | |
| 6,754,650 B2 | 6/2004 | Cho et al. | |
| 6,772,415 B1 | 8/2004 | Danckaert et al. | |
| 6,785,677 B1 | 8/2004 | Fritchman | |
| 6,792,546 B1 | 9/2004 | Shanklin et al. | |
| 6,880,087 B1 | 4/2005 | Carter | |
| 6,912,526 B2 | 6/2005 | Akaboshi | |
| 6,952,694 B2 | 10/2005 | Mathur et al. | |
| 6,952,821 B2 | 10/2005 | Schreiber | |
| 7,225,188 B1 | 5/2007 | Gai et al. | |
| 7,260,558 B1 | 8/2007 | Cheng et al. | |
| 7,594,260 B2 | 9/2009 | Porras et al. | |
| 2002/0021838 A1 | 2/2002 | Richardson et al. | |
| 2004/0068501 A1 | 4/2004 | McGoveran | |
| 2005/0114700 A1 | 5/2005 | Barrie et al. | |
| 2006/0085858 A1 | 4/2006 | Noel et al. | |
| 2007/0074195 A1 | 3/2007 | Liao et al. | |
| 2007/0192861 A1 | 8/2007 | Varghese et al. | |

(Continued)

OTHER PUBLICATIONS

Jonsson et al., "Verifying Safety Properties of a Class of Infinite-State Distributed Algorithms", Lecture Notes in Computer Science, 1995, vol. 939, pp. 42-53.*

(Continued)

*Primary Examiner* — Alan Chen
*Assistant Examiner* — Paulinho E Smith
(74) *Attorney, Agent, or Firm* — Goodwin Procter LLP; Steven A. Moore

(57) ABSTRACT

Methods, apparatus, and computer software product for making a decision based on the semantics of formal logic are provided. In an exemplary embodiment, two custom computing apparatuses are used to resolve the satisfiability of a logical formula and provide an example. In this embodiment, the two custom computing apparatuses operate in concert to explore the space of possible satisfying examples. This Abstract is provided for the sole purpose of complying with the Abstract requirement rules. This Abstract is submitted with the explicit understanding that it will not be used to interpret or to limit the scope or the meaning of the claims.

129 Claims, 8 Drawing Sheets

(56) References Cited

U.S. PATENT DOCUMENTS

| | | |
|---|---|---|
| 2008/0010680 A1 | 1/2008 | Cao et al. |
| 2009/0037889 A1 | 2/2009 | Li et al. |
| 2009/0083724 A1 | 3/2009 | Eichenberger et al. |
| 2009/0259997 A1 | 10/2009 | Grover et al. |
| 2009/0307673 A1 | 12/2009 | Eichenberger et al. |
| 2010/0050164 A1 | 2/2010 | Van De Waerdt et al. |
| 2010/0162225 A1 | 6/2010 | Huang et al. |

OTHER PUBLICATIONS

Mahajan et al., "Zchaff2004: An Efficient SAT Solver", LNCS, 2005, 360-375.*
International Report on Patentability dated Mar. 31, 2011 for PCT Application No. PCT/US2009/057194.
International Preliminary Report on Patentability dated Oct. 27, 2011 for PCT Application No. PCT/US2010/031524.
International Preliminary Report on Patentability dated Jan. 6, 2009 for PCT Application No. PCT/US2007/72260.
International Preliminary Report on Patentability dated Nov. 1, 2011 for PCT Application No. PCT/US2010/033049.
Bondhugula et al. Toward Effective Automatic Parallelization for Multi\par core Systems. In proceeding of 22nd IEEE International Symposium on Parallel and Distributed Processing, (IPDP 2008) Miami, Florida USA, Apr. 14, 2008.
International Search Report and the Written Opinion dated Nov. 26, 2010 for PCT Application No. PCT/US2010/031524.
International Search Report and Written Opinion dated Dec. 1, 2010 for PCT/US2010/033049.
Ahmed et al, Synthesizing Transformations for Locality Enhancement of Imperfectly-nested Loops Nests, ACM ICS 2000, pp. 141-152.
Ahmed et al, Tiling Imperfectly-nested Loop Nests, IEEE 2000,14 pgs.
Aho et al, Compilers, Principles, Techniques, and Tools, Addison-Wesley Publishing Company, pp. 173-186, Reading, MA 1985.
Aho et al, Efficient String Matching: An Aid to Bibliographic Search, Communications of the ACM, vol. 18, No. 6, Jun. 1975, pp. 333-340.
Aigner et al, An Overview of the SUIF2 Compiler Infrastructure, Computer Systems Laboratory, Standford University, 1999, pp. 1-14.
Aldwairi et al, Configurable String Matching Hardware for Speeding Up Intrusion Detection, ACM SIGARCH Computer Architecture News, Vo. 33, No. 1, Mar. 2005, pp. 99-107.
Allen et al, Conversion of Control Dependence to Data Dependence, ACM 1983, pp. 177-189.
Ancourt et al, Scanning Polyhedra with DO Loops, Proceedings of the third ACM SIGPLAN symposium on Principles and practice of parallel programming, Apr. 21-24, 12 pgs. 1991.
Appel, A.W., Deobfuscation is in NP, Princeton University, Aug. 21, 2002, 2 pgs.
Ayers et al, Aggressive Inlining, PLDI '92 Las Vegas, NV, USA.
Ball et al, Branch Prediction for Free, Technical Report #1137, University of Wisconsin, 1993, 29 pgs.
Barak et al, On the (Im)possibility of Obfuscating Programs, Advances in Cryptology, CRYPTO 2001, vol. 2139, pp. 1-18.
Barthou et al, Maximal Static Expansion, International Journal of Parallel Programming, vol. 28, No. 3, 2000, 20 pgs.
Bastoul et al, Putting Polyhedral Loop Transformations to Work, INRIA, No. 4902, Jul. 2003.
Bastoul, C., Generating Loops for Scanning Polyhedra: CLooG User's Guide, First Version, Rev. 1.6, Apr. 8, 2004, pp. 1-30.
Bastoul, Code Generation in the Polyhedral Model Is Easier Than You Think, Proceedings of the 13th International Conference on Parallel Architecture and Compilation Techniques, 2004.
Bastoul, Efficient Code Generation for Automatic Parallelization and Optimization, Proceedings of the Second International Symposium on Parallel and Distributed Computing, 2003.
Bednara et al, Synthesis for FPGA Implementations From Loop Algorithms, In Proceedings ofthe Int. Conf. on Engineering of Reconfigurable Systems and Algorithms (ERSA), Jun. 2001.
Berkelaar et al, The IpSolve Package, Sep. 21, 2007, pp. 1-9.

Bik et al, Implementation of Fourier-Motzkin Elimination, Technical Report 94-42, Department. of Computer Science, Leiden University, 1994.
Bondhugula et al, A Practical Automatic Polyhedral Parallelizer and Locality Optimizer, PDLI '08, Jun. 7-13, 2008.
Bondhugula et al, Affine Transformations for Communication Minimal Parallelization and Locality Optimization of Arbitrarily Nested Loop Sequences, OSU CSE Technical Report, OSU-CISRC-5/07/TR43, pp. 1-30.
Bondhugula et al, Automatic Mapping of Nested Loops to FPGAs, OSU, Mar. 19, 2007.
Bondhugula et al,A Practical and Fully Automatic Polyhedral Program Optimization System,OSU OSU-CISRC-10/07-TR70.
Boulet et al, (Pen)-ultimate tiling?, Laboratoire de l'Informatique du Parallelisme, Research Report No. 93-96, Nov. 1993, pp. 1-17.
Boulet et al, Scanning polyhedra without Do-loops, Parallel Architectures and Compilation Techniques, 1998, Proceedings 1998 International Conference on Oct. 12-18, 1998, pp. 4-11.
Briggs et al, Effective Partial Redundancy Elimination, Sigplan PLDI, Jun. 1994, pp. 1-12.
Brumley et al, Towards Automatic Generation of Vulnerability-Based Signatures, Proceedings of the 2006 IEEE Symposium on Security and Privacy, pp. 1-15.
Burger et al, Scaling to the End of the Silicon with EDGE Architectures, Computer, Jul. 2004, pp. 44-55.
Burke et al, Flow-Insensitive Interprocedural Alias Analysis in the Presence of Pointers, Lecture Notes in Computer Science, Proceedings from the 7th International Workshop on Languages and Compilers for Parallel Computing, vol. 892, 1995, 18 pgs.
Cifuentes, C., A Structuring Algorithm for Decompilation, XIX Conferencia Latinoamericana de Inforamatica, Buenos Aires, Argentina, Aug. 2-6, 1993, pp. 267-276.
Cifuentes,Structuring Decompiled Graphs, Department of Computer Science, University of Tasmania, 1994, 15 pgs.
Clauss et al, Automatic Memory Layout Transformations to Optimize Spatial Locality in Parameterized Loop Nests, ACM SIGARCH Computer Architecture News, vol. 28, No. 1, 2000, pp. 1-9.
Clauss et al, Deriving Formulae to Count Solutions to Parameterized Linear Systems using Ehrhart Polynomials: Applications to the Analysis of Nested-Loop Programs, Apr. 10, 1997.
ClearSpeed—Accelerator Technology Primer, ClearSpeed Technology Primer, ClearSpeed Technology, Inc., 2006.
ClearSpeed—ClearSpeed Programming Model: An introduction, ClearSpeed Technology Inc. 2007.
ClearSpeed—ClearSpeed Programming Model: Card-side Libraries, ClearSpeed Technology Inc. 2007.
ClearSpeed—ClearSpeed Programming Model: Optimizing Performance, ClearSpeed Technology Inc. 2007.
ClearSpeed—CSX Processor Architecture Whitepaper, ClearSpeed Technology Plc., 2006.
ClearSpeed—Introduction to ClearSpeed Acceleration, ClearSpeed Technology Inc., 2007, 27 pages.
ClearSpeed—Introduction to ClearSpeed Acceleration, Powerpoint presentation, ClearSpeed Technology Plc, 2007, 133 pgs.
ClearSpeed—Overview of Architecture: System Level (host) Architecture and ClearSpeed Architecture, ClearSpeed Technology Inc., 2007.
ClearSpeed Introductory Programming Manual—The ClearSpeed Software Development Kit, ClearSpeed Technology Inc. 2007.
ClearSpeed Programming Model: Case Study, ClearSpeed Technology Inc., 2007.
ClearSpeed Technical Training: Software Development, ClearSpeed Technology Inc., 2007.
Click et al, A Simple Graph-Based Intermediate Representation, ACM IR'95, 1995, pp. 35-49.
Click, C., Global Code Motion Global Value Numbering, ACM SIGPLAN' 95, pp. 246-257, 1995.
Collard et al, Automatic Generation of Data Parallel Code, Proceedings of the Fourth International Workshop on Compilers for Parallel Computers, Dec. 1993.
Collard et al, Fuzzy Array Dataflow Analysis, ACM Principles and Practice of Parallel Programming, PPOpp'95, Jul. 1995, 10 pgs.

(56) References Cited

OTHER PUBLICATIONS

Collberg et al, A Taxonomy of Obfuscating Transformations, Technical Report 148, Department of Computer Science, University of Auckland, Jul. 1997. http://www.cs.auckland.ac.nz/-Ccollberg/Research/Publications/CollbergThomborsonLow97a.

Collberg et al, Manufacturing Cheap, Resilient, and Stealthy Opaque Constructs, POPL 98, San Diego, CA 1998.

Cooper et al, Operator Strength Reduction, ACM Transactions on Programming Languages and Systems, vol. 23, No. 5, pp. 603-625, Sep. 2001.

Cooper et al, SCC-Based Value Numbering, CRPC-TR95636-S, Oct. 1995, pp. 1-12.

Cousot et al, Abstract Interpretation: A Unified Lattice Model for Static Analysis of Programs by Construction or Approximation of Fixpoints, Conference Record of the Fourth ACM Symposium on Principles of Programming Languages, Jan. 17-19, 1977, 16 pgs.

Cytron et al, Efficiently Computing Static Single Assignment Form and The Control Dependence Graph, Mar. 7, 1991, pp. 1-52.

Darte et al, Automatic parallelization based on multi-dimensional scheduling, Research Report No. 94-24, Laboratoire de l'Informatique de Parallelisme, 1994, pp. 1-34.

Darte et al, Lattice-Based Memory Allocation, ACM CASES'03, pp. 298-308, 2003.

Darte et al, Lattice-Based Memory Allocation, IEEE Transactions on Computers, vol. 54, No. 10, Oct. 2005, pp. 1242-1257.

Darte et al, Lattice-Based Memory Allocation, Research Report No. 2004-23, Apr. 2004, 1-43.

Darte et al, Revisiting the decomposition of Karp, Miller and Winograd, Parallel Processing Letters, 1995.

Ezick et al, ALEF: A SAT Solver for MPI-Connected Clusters, Technical Report, Aug. 13, 2008, 21 pgs.

Featurier, Some efficient solutions to the affine scheduling problem Part I One-dimensional Time, Laboratoire MASI, Institute Blaise Pascal, Universite de Versailles St-Quentin, Apr. 23, 1993.

Feautrier et al, Solving Systems of Affine (In)Equalities: PIP's User's Guide, 4th Version, rev. 1.4, Oct. 18, 2003, pp. 1-25.

Feautrier, P., Array Expansion, Universite de Versailles St-Quentin, Jul. 1988, pp. 1-20.

Feautrier, P., Dataflow Analysis of Array and Scalar References, Int. J. of Parallel Programming, vol. 20, No. 1, 1991, pp. 1-37.

Feautrier, P., Parametric Integer Programming, RAIRO Operationnelle, vol. 22, Sep. 1988, pp. 1-25.

Feautrier, P., Some efficient solutions to the affine scheduling problem, Part II, Multidimensional Time, IBP/MASI, No. 92.78, 1992, pp. 1-28.

Ferrante et al, The Program Dependence Graph and Its Use in Optimization, ACM Transactions on Programming Languages and Systems, vol. 9, No. 3, Jul. 1987, pp. 319-349.

Gautam et al, The Z-Polyhedral Model, SIGPLAN Symp. on Principles and Practice of Parallel Programming, pp. 237-248, New York, NY, USA, 2007.

George et al, Iterated Register Coalescing, ACM Transactions on Programming Languages and Systems, vol. 18, No. 3, May 1996, pp. 300-324.

Ghosh et al, Cache Miss Equations: A Compiler Framework for Analyzing and Tuning Memory Behavior, ACM Transactions on Programming Languages and Systems, vol. 21, No. 4, Jul. 1999, pp. 702-745.

Griebl et al, Code Generation in the Polytope Model, pact, pp. 106, Seventh International Conference on Parallel Architectures and Compilation Techniques (PACT'98), 1998.

Griebl et al, Space-Time Mapping and Tiling: A Helpful Combination, Concurrency and Comput.: Pract. Exper. 2004, 16:221-246.

Griebl, Automatic Parallelization of Loop Programs for Distributed Memory Architectures, Fakultat fur Mathematik und Informatik, Jun. 2, 2004.

Gu et al, Symbolic Array Dataflow Analysis for Array Privatization and Program Parallelization, Proceedings of Supercomputing '95, pp. 1-19, 1995.

Gustafson et al, ClearSpeed—Whitepaper: Accelerating the Intel® Math Kernel Library, ClearSpeed Technology Inc., 2006.

Heintze et al, Ultra-fast Aliasing Analysis Using CLA: A Million Lines of C Code in a Second, ACM SIGPLAN Notices, vol. 36, No. 5, 2001, 10 pgs.

Intel® QuickAssist Technology Accelerator Abstraction Layer (AAL), White Paper, Intel® Corporation, 2007, 8 pgs.

International Search Report and the Written Opinion dated Mar. 18, 2010 for PCT Application No. PCT/US2009/057194.

International Search Report and the Written Opinion of the International Searching Authority dated Jan. 17, 2008 for PCT Application No. PCT/US2007/72260.

Irigoin et al, Supernode Partitioning, Proceedings of the 15th Annual ACM SIGACT-SIGPLAN Symposium on Principles of Programming Languages, San Diego, CA, Jan. 1988.

Jimenez et al, Register Tiling in Nonrectangular Iteration Spaces, ACM Transactions on Programming Languages and Systems, vol. 24, No. 4, pp. 409-453, Jul. 2002.

Kandemir et al, Optimizing Spatial Locality in Loop Nests using Linear Algebra, Proc. 7th International Workshop on Compliers for Parallel Computers, Sweden Jun. 1998.

Kelly et al, Code Generation for Multiple Mappings, frontiers, Fifth Symposium on the Frontiers of Massively Parallel Computation (Frontiers '95), 1995, pp. 1-11.

Kelly, W. A., Ph.D. Dissertation, Optimization within a Unified Transformation Framework, Dec. 8, 1996, pp. 1-89.

Kildall, G.A., A Unified Approach to Global Program Optimization, Annual Symposium on Principles of Programming Languages, Proceedings of the 1st annual ACM SIGACT-SIGPLAN symposium on Principles of programming languages, pp. 194-206, 1973.

Knoop et al, Partial Dead Code Elimination, Conference on Programming Language Design and Implementation, Proceedings of the ACM SIGPLAN 1994 conference on Programming language design and implementation, pp. 147-158, 1994.

Kodukula et al, An Experimental Evaluation of Tiling and Shacking for Memory Hierarchy Management, ACM ICS'99, 1999, pp. 482-491.

Lam, M., Software Pipeline: An Effective Scheduling Technique for VLIW Machines, Proceedings of the SIGPLAN '88 Conference on Programming Language Design and Implementation, Jun. 22-24, 1988, pp. 318-328.

Landi, W. Undecidability of Static Analysis, From ACM Letters on Programming Languages and Systems, vol. 1, No. 4, 1992, pp. 1-17.

Le Verge, H., A Note on Chernikova's Algorithm, Research Report, Jul. 27, 1994, pp. 1-25.

Lengauer et al, A Fast Algorithm for Finding Dominators in a Flowgraph, ACM Transaction on Programming Languages and Systems, vol. 1, No. 1, Jul. 1979, pp. 121-141.

Lethin et al, Mapping Loops for the ClearSpeed Processor Using the R-Stream Compiler, Feb. 4, 2008.

Lethin et al, The R-Stream 3.0 Compiler, Dec. 18, 2007.

Lethin et al, The R-Stream 3.0 Compiler, Feb. 4, 2008.

Lethin et al, The R-Stream 3.0: Polyheadral Mapper, XPCA Review, Feb. 6, 2007.

Lethin, Software Tools to Optimize BMD Radar Algorithms to COTS Hardware—Final Report, Sep. 12, 2007.

Lim et al, Blocking and Array Contraction Across Arbitrarily Nested Loops Using Affine Partitioning, ACM PPOPP'01, 2001, pp. 1-10.

Lim et al, Maximizing Parallelism and Minimizing Synchronization with Affine Transforms, 24th Annual ACM SIGPLAN-SIGACT Symposium on Principles of Programming Languages, Paris, France, Jan. 1997.

Loechner et al, Precise Data Locality Optimization of Nested Loops, The Journal of Supercomputing, 21, pp. 37-76, 2002.

Maydan et al, Array Data-Flow Analysis and its Use in Array Privatization, ACM-20th PoPL-1, 1993, pp. 2-15.

McWhirter et al, Normalised Givens Rotations for Recursive Least Squares Processing, VLSI Signal Processing, VIII, 1995. IEEE Signal Processing Society [Workshop on], 1995, pp. 323-332.

Megiddo et al, Optimal Weighted Loop Fusion for Parallel Programs, ACM Symposium on Parallel Algorithms and Architectures archive Proceedings of the ninth annual ACM symposium on Parallel algorithms and architectures, pp. 282-291, 1997.

(56) References Cited

OTHER PUBLICATIONS

Meister et al, Optimizing and Mapping Tool Chain for FPGA Programming—Final Report Phase 1 SBIR Project, Sep. 28, 2007.
Meister et al., Static Software Tools to Optimize BMD Radar Algorithms to COTS Hardware, Quarterly Report #1, 2008, pp. 1-22.
Meister, B. Stating and Manipulating Periodicity in the Polytope Model. Applications to Program Analysis and Optimization, Universite Louis Pasteur Strasbourg, 2004, pp. 1-138.
Nookala et al, A Library for Z-Polyhedral Operations, Publication Interne No. 1330, IRISA, Publication No. 1330, May 2000, pp. 1-29.
Pop et al, Fast Recognition of Scalar Evolutions on Three-Address SSA Code, CRI/ENSMP Research Report, A/354/CRI, Apr. 1, 2004.
Pop et al, Induction Variable Analysis with Delayed Abstractions, ACM Transactions on Architecture and Code Optimization, vol. V, No. N, pp. 1-30, Aug. 2005.
Pugh, W. The Omega Test: a fast and practical integer programming algorithm for dependence analysis, ACM, Aug. 1992, pp. 1-19.
Quillere et al, Generation of Efficient Nested Loops from Polyhedra, 2000 Kluwer Academic Publishers, 2000.
Quinton et al, On Manipulating Z-polyhedra, IRISA, Publication Interne No. 1016, Jul. 1996.
Quinton et al, The Mapping of Linear Recurrence Equations on Regular Arrays, Journal of VLSI Signal Processing, vol. 1, 35 pgs. (1989).
Rabinkin et al, Adaptive Array Beamforming with Fixed-Point Arithmetic Matrix Inversion using Givens Rotations, Proc. SPIE vol. 4474, 2001, pp. 294-305.
Rau, B. R., Iterative Modulo scheduling: An Algorithm for Software Pipelining Loops, ACM MIRCRO, 1994, pp. 63-74.
Reconfigurable Application-Specific Computing User's Guide, 2007, pp. 1-257.
Renganarayana, et al, A Geometric Programming Framework for Optimal Multi-Level Tiling, Conference on High Performance Networking and Computing, Proceedings of the 2004 ACM/IEEE conference on Supercomputing, 2004, 14 pgs.
Reservoir Labs, Software Tools to Optimize BMD Radar Algorithms to COTS Hardware: Phase II Proposal, Topic No. MDA06-031, Proposal No. B2-1415.
Ros-Girolt et al, Compilation and Optimization of Protocol Analyzers for High-Speed Network Intrusion Prevention, High Performance Networks / High-Speed Network Security Systems, Topic No. 41b, Reservoir Labs, Inc. 2009, pp. 1-54.
Sankaralingam et al, Distributed Microarchitectural Protocols in the TRIPS Prototype Processor, International Symposium on Microacritecture, Proceedings of the 39th Annual IEEE/ACM International symposium on Microarchitecture, 2006, 12 pgs.
Schreiber et al, Near-Optimal Allocation of Local Memory Arrays, HP Laboratories Palo Alto, HPL-2004-24, Feb. 17, 2004.
Schwartz et al, VSIPL 1.1 API, 2002, pp. 1-739.
Seghir et al, Counting Points in Integer Affine Transformation of Parametric Z-polytopes, Research report, Universite Louis Pasteur, LSITT (UMR CNRS 7005), Mar. 2007, pp. 1-24.
Seghir et al, Memory Optimization by Counting Points in Integer Transformation of Parametric Polytopes, ACM CASES'06, 2006, pp. 74-82.
Simpson, L. T., Thesis, Value-Driven Redundancy Elimination, Rice University, 1996, pp. 1-150.
Song et al, A Compiler Framework for Tiling Imperfectly-Nested Loops, Languages and Compilers for Parallel Computing, vol. 1863, 2000, pp. 1-17.
Springer et al, An Architecture for Software Obfuscation—Final Technical Report for Phase 1 SBIR, Jul. 30, 2007.
Springer et al, An Architecture for Software Obfuscation, PowerPoint presentation, 2007.
The Polylib Team, Polylib User's Manual, Apr. 24, 2002, pp. 1-44.
Touati et a, Early Control of Register Pressure for Software Pipelined Loops, In Proceedings of the International Conference on Compiler Construction (CC), Warsaw, Poland, Apr. 2003. Springer-Verlag, 15 pgs.
Tu et al, Automatic Array Privatization, Lecture Notes in Computer Science, vol. 1808, 2001, 22 pgs.
Tu, P., Thesis, Automatic Array Privatization and Demand-Driven Symoblic Analysis, University of Illinois, 1995, pp. 1-144.
Udupa et al, Deobfuscation—Reverse Engineering Obfuscated Code, Proceedings of the 12th Working Conference on Reverse Engineering (WCRE'05), 10 pgs. 2005.
Vangal et al, An 80-Tile 1.28TFLOPS Network-on-Chip in 65Nm CMOS, ISSCC 2007, Session 5, Microprocessors/5.2, 3 pgs.
Vasilache et al, Polyhedral Code Generation in the Real World, Compiler Construction, vol. 3923, 2006, 15 pgs.
Vasilache, Scalable Program Optimization Techniques in the Polyhedral Model, Thesis, Universite de Paris-SUD, UFR Scientifique d'orsay Inria Futures, Sep. 28, 2007.
Verdoolaege et al, Counting Integer Points in Parametric Polytopes using Barvinkok's Rational Functions, Algorithmica, 2007, pp. 1-33.
Wang, C., Dissertation—A Security Architecture for Survivability Mechanisms, University of Virginia, 2000, pp. 1-209.
Wegman et al, Constant Propagation with Conditional Branches, ACM Transactions on Programming Languages and Systems, vol. 13, No. 2, Apr. 1991, pp. 181-210.
Weise et al, Value Dependence Graphs: Representation Without Taxation, Annual Symposium on Principles of Programming Languages, Proceedings of the 21st ACM SIGPLAN-SIGACT symposium on Principles of programming languages, 1994, 14 pgs.
Whaley et al, An Efficient Inclusion-Based Points-To Analysis for Strictly-Typed Languages, Lecture Notes in Computer Science, vol. 2477, 2002, 16 pgs.
Wilde, D. K., A Library for Doing Polyhedral Operations, IRISA, Publication No. 785, 1993, pp. 1-48.
Wolf et al, A Data Locality Optimizing Algorithm, Proceedings of the ACM SiGPLAN '91 Conference on Programming Language Design and Implementation, Jun. 26-28, 1991, pp. 30-44.
Wu et al, Static Branch Frequency and Program Profile Analysis, 27th IEEE/ACM International Symposium on Microarchitecture (MICRO-27), 1994, 11 pgs.
Xue et al, Enabling Loop Fusion and Tiling for Cache Performance by Fixing Fusion-Preventing Data Dependences, Proceedings of the 2005 International Conference on Parallel Processing (ICPP'05), 2005, pp. 1-9.
Darte et al, Scheduling and Automatic Parallelization, Chapter 5: Parallelelism Detection in Nested Loops, Birkhauser Boston, 2000, pp. 193-226.
Franke et al, Compiler Transformation of Pointers to Explicit Array Accesses in DSP Applications, Institute for Computing Systems Architecture (ICSA), University of Edinburgh, 2001.
Griebl et al, Forward Communication Only Placements and their Use for Parallel Program Construction, University of Passau, 2002.
Griebl, On the Mechanical Tiling of Space—Time Mapped Loop Nests, Technical Report MIP-0009, Fakultät für Mathematik and Informatik, Universität Passau, Germany, 2000.
JGAP Frequently Asked Questions, Sourceforge.net, Accessed 2007, pp. 1-61.
Lethin et al, R-Stream: A Parametric High Level Compiler, Reservoir Labs, Inc., 2006, 2 pgs.
Quillere et al, on Code-Generation in the Polyhedral Model, 2001, 10 pgs.
Reservoir Labs, Inc., Optimizing and Mapping Tool Chain for FPGA Programming, Phase II Proposal, Proposal No. D2-0627, Dec. 2007, 40 pgs.
Ros-Giralt et al, Generation of High-Performance Protocol-Aware Analyzers with Applications in Intrusion Detection Systems, Proc. SPIE 7709, Cyber Security, Situation Management, and Impact Assessment II; and Visual Analytics for Homeland Defense and Security II, 770909 (Apr. 28, 2010), 8 pgs.
The Cell Roadmap, Published on PPCNUX at http://www.ppcnux.com/?q=print/6666, Accessed 2006.
Vasilache et al, Alef: A SAT Solver for MPI-Connected Clusters, Reservoir Labs, Mar. 2009, 6 pgs.
Xue, On Tiling as a Loop Transformation, Department of Mathematics, Statistics and Computing Science, University of New England, Australia, 1997, 15 pgs.

* cited by examiner

SYSTEMS, METHODS AND APPARATUS FOR DISTRIBUTED DECISION PROCESSING

CROSS REFERENCE TO RELATED APPLICATIONS

This application is related to and claims the benefit of priority to U.S. Provisional Application Ser. No. 61/158,665, entitled "ALEF: A SAT SOLVER FOR MPI-CONNECTED CLUSTERS", filed Mar. 9, 2009, the entirety of which is hereby incorporated by reference.

GOVERNMENT INTERESTS

Portions of this invention were made with U.S. Government support under DARPA ACIP program contract number W31P4Q-05-C-R171. The U.S. Government has certain rights.

FIELD OF THE INVENTION

The present invention generally concerns data processing. More particularly, the invention concerns a system, methods, and apparatus for distributed decision processing.

BACKGROUND OF THE INVENTION

Distributed decision models are useful in a variety of problems. One important area where distributed decision processing has seen some benefit is within an area known in the art as Boolean Satisfiability (SAT) problems. SAT problems arise in a number of arenas, but one of importance is in the field of integrated circuit design and verification. As the demand for more functional consumer electronics has increased, so has the complexity of the integrated circuits powering the consumer electronics. With the increase in the complexity of the circuit there have been significant increases in the challenges within the design and verification of these more complex circuits.

In the verification process there are a number of computerized techniques employed. For example, a common technique for verification of digital designs is known as model checking. Model checking is typically implemented with a Binary Decision Diagram (BDD). With recent advances in SAT solvers they are proving to be a reasonable alternative to BDD's in digital circuit verification. A given Boolean formula is considered satisfiable if all the variables in the formula can take on such values to make the formula evaluate to true. Alternatively, and potentially more important, if no combination of values can be found that forces the function to evaluate to true, then the formula is unsatisfiable.

SAT solvers typically require the function to be expressed in Conjunctive Normal Form (CNF) which is a conjunction of clauses, where a clause is a disjunction of literals. A literal is either a variable name or its negation. A satisfying assignment returned by the SAT solver corresponds to a counterexample of length k. If the problem is unsatisfiable at length k, the SAT returns a proof that there are no counterexamples of length less than or equal to k.

The DPLL (Davis-Putnam-Logemann-Loveland algorithm) is a complete, backtracking-based algorithm for deciding the satisfiability of propositional logic formulae in conjunctive normal form, i.e., for solving the CNF-SAT problem. The basic backtracking algorithm runs by choosing a branching literal, assigning a truth value to it, simplifying the formula, and then recursively checking if the simplified formula is satisfiable. If this is the case, the original formula is satisfiable; otherwise, the same recursive check is done assuming the opposite truth value. This is known as the splitting rule, as it splits the problem into two simpler sub-problems. The simplification step essentially removes all clauses which become true under the assignment from the formula, and all literals that become false from the remaining clauses.

Multiple contributions well-known by engineers knowledgeable in the field have been proposed in the literature, mainly in three directions: 1. defining different policies for choosing the branching literals; 2. defining new data structures to make the algorithm faster, especially the part on unit propagation; and 3. defining variants of the basic backtracking algorithm. The latter direction includes non-chronological backtracking and clause learning. These refinements describe a method of backtracking after reaching a conflict clause which "learns" the root causes (assignments to variables) of the conflict in order to avoid reaching the same conflict again. Intuitively, backtracking can be viewed as jumping back to the root problem in a sequence of decisions and making the opposite decision.

The following strategies are well-known by engineers knowledgeable in the field: Restarts: have been previously introduced in the literature as a way to break a sequence of bad decision by starting over at certain points in the resolution and resetting the heuristic that chooses the branching literals. Number of learned clauses per conflict: each conflict can be summarized by multiple learned clauses that avoid reaching this conflict again. Traditional algorithms have been using one of such clause per conflict. Conflict clause minimization: has been introduced in the literature and is a technique to make the learned conflict clauses as small as possible. Decision replay: has been introduced in the literature to replay decisions that were not proven bad. The intuition is to avoid discarding useful choices when a backtracking goes too far to undo the root decision problem. Database compaction: the number of clauses can grow to unmanageable sizes; database compaction discards learned clauses.

With complex digital designs, verification approaches can be significantly complex and the memory limits of a computer can be quickly reached. Therefore, there exists a need for more efficient SAT solvers.

SUMMARY OF THE INVENTION

The present invention provides a system, apparatus, and methods for distributed decision processing. Various embodiments of the present invention provide a method, apparatus, and computer software product for generating solutions to logical decision problems through the use of multi-processing element computing apparatus. In one embodiment, a method is provided that receives a formula in a memory; the method then generates multiple replications of the formula. In some embodiments, the number of replications of the formula is related to the number of processing elements available on the computing apparatus. The provided method then assigns one replication to a first processing element and another to a second processing element. Each of the processing elements is then configured to solve the formula using, in some embodiments, different solution tactics. The method further allows each of these processing elements to communicate with each other over a message-passing interface. In some embodiments, information passed across the message-passing interface is used by the receiving processing element in its solution of the formula.

In another embodiment of a provided method, the parametric space of options available to each of a plurality of processing elements is defined. In some embodiments, this space is related to decision procedures available to the processing elements. In this method, a choice of instantiation of one or more of the procedures is additionally distributed to the processing elements. Each of the processing elements may then separately instantiate a subset of options in the space based on its choice of instantiation.

Another embodiment provides a custom computing apparatus. This custom computing apparatus contains a number of processing elements and a memory. Contained within the memory are a set of processor executable instructions that, when executed by at least one of the processors, configures the custom computing apparatus to generate a solution to a logical decision problem. In one embodiment of this configuration, a formula is received in a memory; the configuration then generates multiple replications of the formula. In some embodiments the number of replications of the formula is related to the number of processing elements available on the computing apparatus. The configuration then assigns one replication to a first processing element and another to a second processing element. Each of the processing elements is then configured to solve the formula using, in some embodiments, different solution tactics. The configuration further allows each of these processing elements to communicate with each other over a message-passing interface. In some embodiments, information passed across the message passing interface is used by the receiving processing element in its solution of the formula.

A further embodiment of a custom computing apparatus is additionally provided. In this embodiment, the computing apparatus also contains multiple processing elements and at least one memory that is in communication with these elements. Contained within the memory is a set of processor executable instructions that, when executed by at least one of the processing elements, configure the computing apparatus to define the parametric space of options available to each of a plurality of processing elements. In some embodiments, this space is related to decision procedures available to the processing elements. In this configuration, a choice of instantiation of one or more of the procedures is additionally distributed to the processing elements. Each of the processing elements may then separately instantiate a subset of options in the space based on its choice of instantiation.

In another embodiment a computer software product is provided. The computer software product includes a non-transitory medium with a set of processor executable instructions. These instructions are such that when executed by a processing element contained with a multiple processing element computing apparatus, they configure the apparatus to generate a solution to a logical decision problem. In one embodiment of this configuration, a formula is received in a memory; the configuration then generates multiple replications of the formula. In some embodiments the number of replications of the formula is related to the number of processing elements available on the computing apparatus. The configuration then assigns one replication to a first processing element and another to a second processing element. Each of the processing elements is then configured to solve the formula using, in some embodiments, different solution tactics. The configuration further allows each of these processing elements to communicate with each other over a message passing interface. In some embodiments, information passed across the message passing interface is used by the receiving processing element in its solution of the formula.

A further provided embodiment of a computer software product additionally includes a non-transitory medium with a set of processor executable instructions on it. In this embodiment, the instructions are sufficient that when executed by at least one processing element of a multiple processing element computing apparatus, they configure the apparatus to define the parametric space of options available to each of a plurality of processing elements. In some embodiments, this space is related to decision procedures available to the processing elements. In this configuration, a choice of instantiation of one or more of the procedures is additionally distributed to the processing elements. Each of the processing elements may then separately instantiate a subset of options in the space based on its choice of instantiation.

These and other features and advantages of the present invention will be appreciated from review of the following detailed description of the invention, along with the accompanying figures in which like reference numerals refer to like parts throughout.

BRIEF DESCRIPTION OF THE DRAWINGS

Various embodiments taught herein are illustrated by way of example, and not by way of limitation, in the figures of the accompanying drawings, in which.

Figure 1:
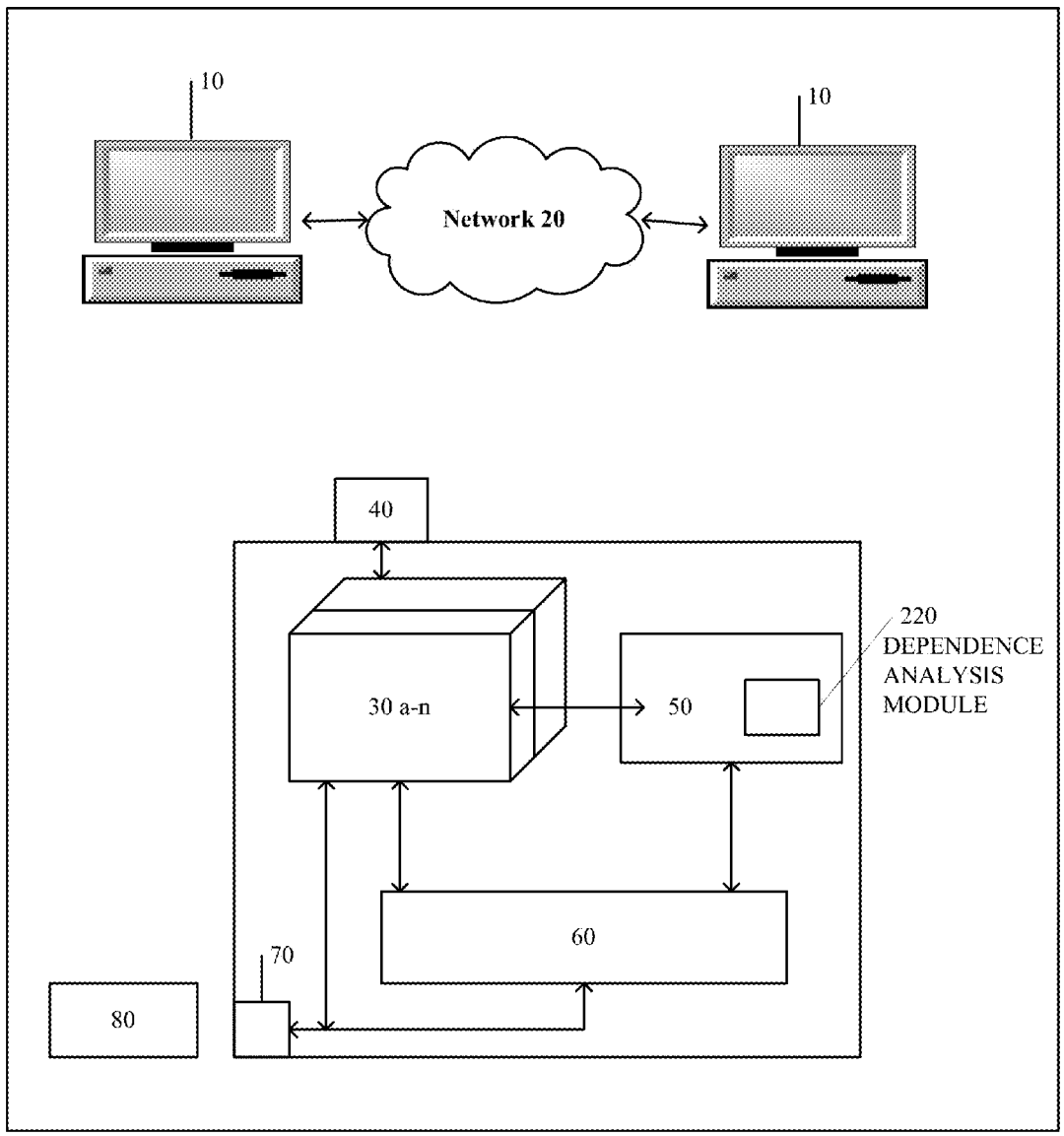
FIG. 1 illustrates a computer network and a custom computing apparatus consistent with provided embodiments.

It will be recognized that some or all of the Figures are schematic representations for purposes of illustration and do not necessarily depict the actual relative sizes or locations of the elements shown. The Figures are provided for the purpose of illustrating one or more embodiments with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. Descriptions of well-known components, methods and/or processing techniques are omitted so as to not unnecessarily obscure the invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

As used in this application, the terms "component," "module," "system," and the like are intended to refer to a computer-related entity, either hardware, firmware, a combination of hardware and software, software, or software in execution. For example, a component can be, but is not limited to being, a process running on a processor, an integrated circuit, an object, an executable, a thread of execution, a program, and/or a computer. By way of illustration, both an application running on a computing device and the computing device can be a component. One or more components can reside within a process and/or thread of execution, and a component can be localized on one computer and/or distributed between two or more computers. In addition, these components can execute from various computer-readable media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

Moreover, various functions described herein can be implemented in hardware, software, firmware, or any combination thereof. If implemented in software, the functions can be stored on or transmitted over as one or more instructions or code on a computer-readable medium. Computer-readable media is non-transitory in nature and includes both computer storage media and communication media including any medium that facilitates transfer of a computer program from one place to another. A storage media can be any available media that can be accessed by a computer. By way of example, and not limitation, such computer-readable media can comprise RAM, ROM, EEPROM, CD-ROM, or other optical disk storage, magnetic disk storage, or other magnetic storage devices, or any other medium that can be used to carry or store desired program code in the form of instructions or data structures and that can be accessed by a computer. Also, any physical connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and blu-ray disc (BD), where disks usually reproduce data magnetically and discs reproduce data optically with lasers. Combinations of the above should also be included within the scope of computer-readable media.

Additionally, in the subject description, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

Embodiments of the present invention provide a custom computing apparatus, illustrated in FIG. 1, that is configured to optimize computer source code for operation on a second computing apparatus. As illustrated, first custom computing apparatus $10(a)$ is configured to communicate with second computing apparatus $10(b)$ across network 20. A further illustration of computing apparatus 10 is provided in FIG. 1. In this illustration, custom computing apparatus $10(a)$ contains at least one processor 30 $(a-n)$, a communication port 40 communicating with the at least one processor 30 $(a-n)$. Custom computing apparatus $10(a)$ additionally includes memory 50, which in some embodiments includes dependence analysis module 220. Custom computing apparatus $10(a)$, in some embodiments, additionally includes drive 70 configured to accept external storage medium 80. In some embodiments, external storage medium 80 is a CD, in others a DVD. In these embodiments, drive 70 is configured to accept the appropriate external storage medium 80. While CD and DVD are specifically enumerated in these embodiments, there are many external storage media that can be used to practice various aspects of the invention; therefore, some embodiments are not limited to the particular drive 70 configuration or external media 80. Custom computing apparatus $1(a)$ additionally includes storage medium 60. Storage medium 60 in some embodiments is a hard-disk drive, and in others is a solid state drive. In some embodiments, storage medium 60 contains a set of processor executable instructions that when executed by the at least one processor $30(a-n)$, they configure custom computing apparatus $10(a)$ to optimize computer code for execution on computing apparatus $10(b)$. While custom computing apparatus $10(a)$ and computing apparatus $10(b)$ are illustrated in FIG. 1 communicating over network 20, various embodiments of the invention do not require this inter-computer communication. As used herein the term "processing element" can be a processor or an execution unit on a processor. Additionally, each processor may contain multiple execution units.

Figure 2:
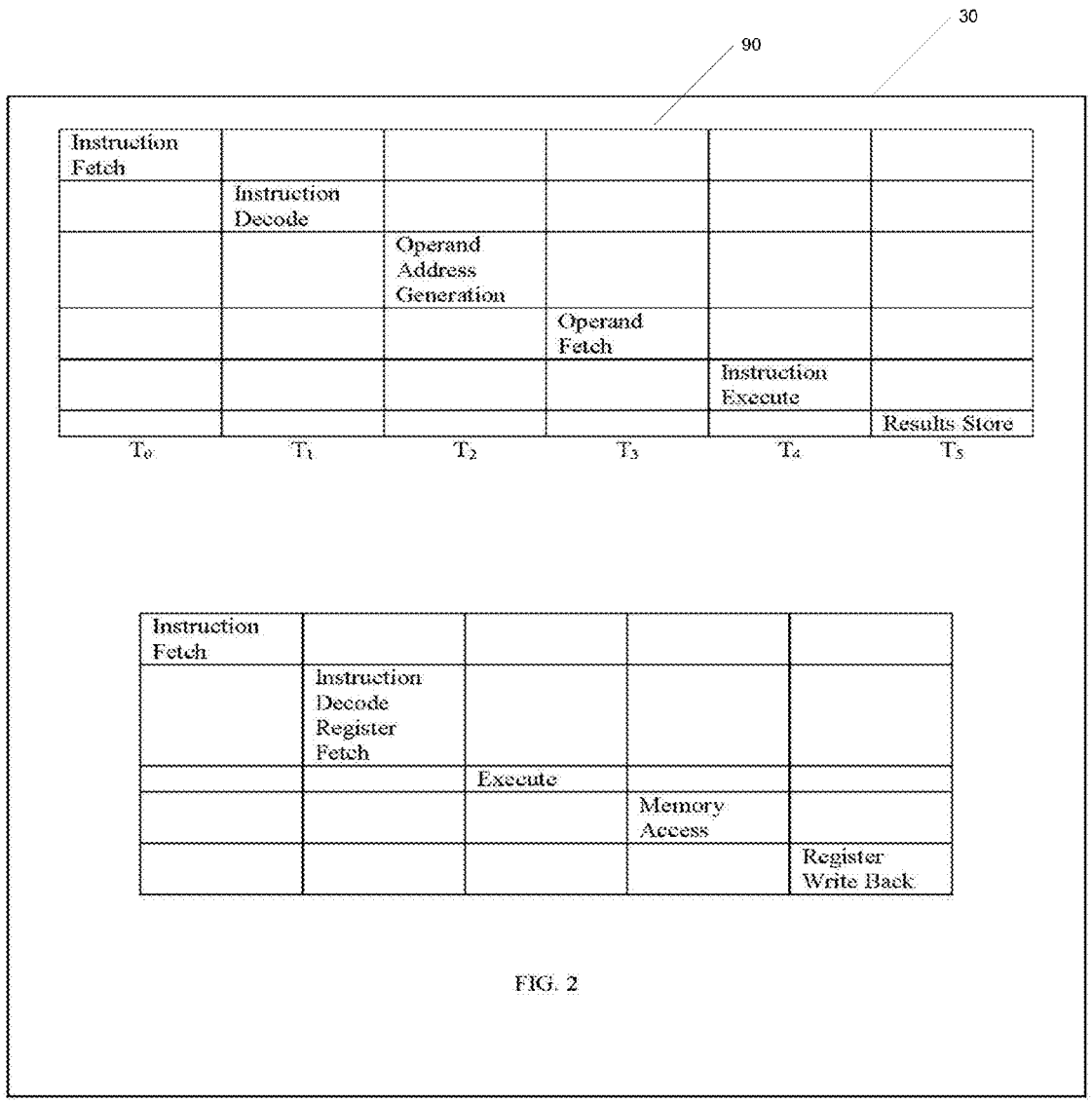
FIG. 2 illustrates processors with multi-stage execution units.

Various embodiments of the present invention are directed to processors containing multi-stage execution units, and in some embodiments multiple execution units. By way of example and not limitation to the particular multi-stage execution unit, FIG. 2 illustrates exemplary multi-stage execution units 90. In one embodiment, a 6-stage execution unit is utilized. In this embodiment, the stages may include instruction fetch, instruction decode, operand address generation, operand fetch, instruction execute, and result store. In another depicted multi-stage architecture, the stages include instruction fetch, instruction fetch & register decode, execute, memory access, and register write-back. During routine operation of a multi-stage execution unit, instructions are processed sequentially moving from stage to stage. In scheduling operations on multi-stage execution unit processors, there are inherent difficulties that arise. For example, one instruction in one stage of the pipeline may attempt to read from a memory location while another instruction is writing to that location. This problem is confounded in the instance of multiple processing cores. Additionally, in multiple processor and/or multiple core architectures, the locality of data to the execution unit attempting access can create significant delays in processing. Additionally, some provided embodiments include the use of multiple processing elements. In some embodiments, these processing elements are threads in a multi-threaded processor; in others they are individual processors. In still further embodiments, they are processing cores or execution units.

As is known in the art the Boolean satisfiability problem (SAT) is a problem that seeks to determine if the variables of a given Boolean formula can be assigned in a way as to make the formula evaluate to 1 or "true". If the set of inputs can be so assigned the formula is "satisfiable". On the other hand, if no such assignment exists, this implies that the formula is identically equal to 0 or "false" for all possible inputs. In this case, the formula is considered "unsatisfiable. Most SAT solvers require the formula under verification to be expressed in conjunctive normal form (CNF) as a conjunction of clauses which is a disjunction of variables or their negations. For example, the CNF formula (a OR b) AND (NOT b OR c) is satisfiable if a=0, b=1 and c=1.

Various embodiments of the present invention are directed to improvements on the DPLL (Davis-Putnam-Logemann-Loveland) algorithm. As is known in the art, the DPLL algorithm is a backtracking-based algorithm for deciding the satisfiability of propositional logic formulae in conjunctive normal form, i.e., for solving the CNF-SAT problem. The basic backtracking algorithm runs by choosing a branching literal, assigning a truth value to it, simplifying the formula, and then recursively checking if the simplified formula is satisfiable; if this is the case, the original formula is satisfiable. Otherwise, the same recursive check is done assuming the opposite truth value. This is known as the splitting rule, as it splits the problem into two simpler sub-problems. The simplification step essentially removes all clauses which become true under the assignment from the formula, and all literals that become false from the remaining clauses.

Various improvements on the DPLL algorithm that are known in the art are typically classified in three areas. First is in defining different policies for choosing the branching literals. The second area is in defining new data structures to make the algorithm faster. The third is in the area of defining variants of the basic backtracking algorithm. This last direction includes non-chronological backtracking and clause learning. These refinements describe a method of backtracking after reaching a conflict clause which "learns" the root causes (assignments to variables) of the conflict in order to avoid reaching the same conflict again. Intuitively, backtracking can be viewed as jumping back to the root problem in a sequence of decisions and making the opposite decision.

One method known in the art for determining if a formula is satisfiable is Conflict Directed Clause Learning. In this method, conflict clauses are derived from logical implications of the original formula clauses that encapsulate learned information about mutually unsatisfiable assignments. The discovery of a conflict clause initiates a backtrack within the current candidate set of assignments to a point that resolves the conflict. For an instance running on a single processor, the conflict clause generation and backtrack routines are tightly coupled. The problem being solved is to abstract these operations in such a way that conflict clauses can be received from external processes while initiating the proper backtrack. The requirement is that the conflict clause received is a properly formatted conflict, derived from the initial replicated clause set, independent of the specific tactics employed in deriving it.

Embodiments of the present invention include systems, methods, and apparatus to manage previously known solution tactics in a novel manner and additionally introduce new tactics. For example, the following pseudo code illustrates a binary back-propagation solution tactic. In this example, the input parameters are as follows: stack (the assignment stack), reasons (a structure that maps the assigned literals to the clauses that forced the assignment), and conflict (a list of literals forming conflict). The pseudo code function returns the parameter result, which is the list of literals forming the resulting conflict.

```
binary_backpropagation(stack, reasons, conflict):
WHILE not done
    changed := FALSE
    FORALL literal in conflict
reason_clause := reason_for_assignment(reasons, literal)
        IF length(reason_clause) equals 2 THEN {
            other_literal := get_other_literal(reason_clause, literal)
            IF level_in_stack(other_literal) < level_in_stack(literal) THEN {
                sign := 1
                IF literal * other_literal less than 0 THEN sign := -1 END IF
                replace_literal_in_conflict(conflict, literal, other_literal * sign)
                changed := TRUE
            } END IF
        } END IF
```

-continued

```
    END FORALL
END WHILE
result := remove_duplicated_literals(conflict)
RETURN result
```

Figure 3:
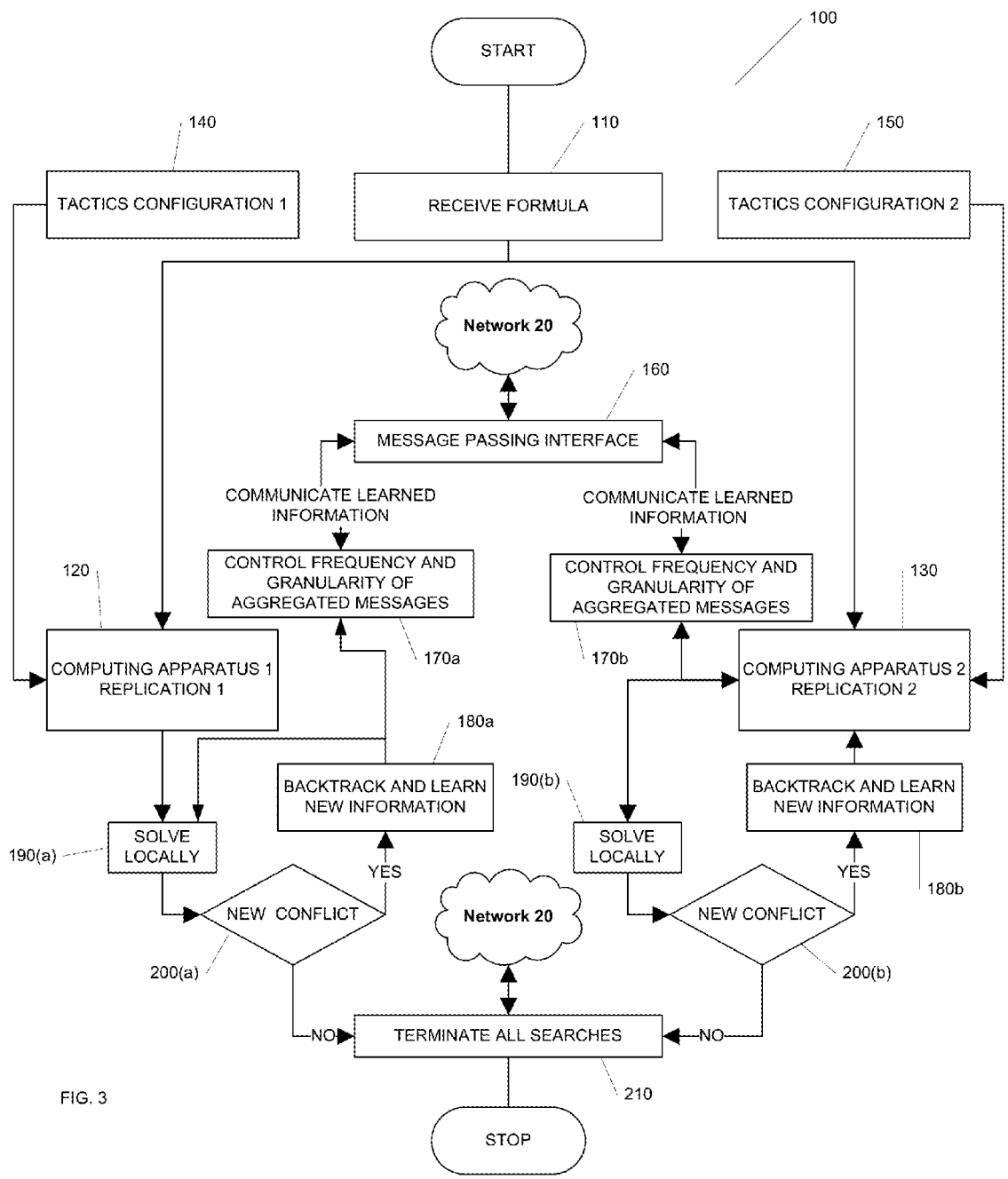
FIG. 3 illustrates an embodiment of a provided method.

An exemplary embodiment of a provided method 100 is illustrated in FIG. 3. In this embodiment, a formula for a logical decision problem is received in memory in block 110. In block 140, a first solution tactic is configured for a first processing element, and in block 150 a second solution tactic is configured for a second processing element. In blocks 120a and 130, a replication of the formula is generated and assigned to each of the processing element. Flow continues to blocks 190(a) and 190(b) where the processing elements begin to solve the formula by the assigned solution tactic. In some embodiments, the solution tactics employed by the processing elements include selection and assignment of literals in the formula. In some instances, these assignments result in conflicts. In these embodiments, flow continues to blocks 200(a) and 200(b) where the process identifies the existence of new conflict clauses. If new conflicts exist, flow continues to blocks 180(a) and 180(b) where the process backtracks to the previous state assignments and the new information related to conflict is learned. The process then continues to 170a and 170b where this new learned information is aggregated and the periodicity of communicating the learned information is controlled. At the appropriate time, flow continues to block 160 where the learned information is communicated to other processing elements across the message-passing interface. Additionally, when the process backtracks to a previous state, flow continues back to blocks 190(a) and 190(b).

In some embodiments, the formula that is replicated and solved contains a propositional logic component. In other embodiments, the solution tactics comprises a search, and decisions made in the course of the search can be saved in the event of a backtrack. In additional embodiments, the solution tactics include a function for replaying decisions made from the backtrack. In still further embodiments, the backtracking function is induced by learned information received on the message-passing interface. In various embodiments, the learned information is shared with other processing elements across the message-passing interface. This learned information can include a subset of conflict clauses derived by the execution of the assigned solution tactic. In other embodiments, this learned information can include a subset of must-implications derived by the execution of the assigned solution tactic. In some embodiments, the solution tactics used may include a restarts enabled tactic, a number of learned clauses per conflict tactic, a conflict clause minimization enabled tactic, a decision replay enabled tactic, a binary back-propagation enabled tactic, a database compaction enabled tactic, and a binary-centric Boolean Constraint Propagation enabled tactic.

Boolean Constraint Propagation (BCP) is a function known in the art for propagating the implications of a logical assignment. After a variable is selected and assigned with a candidate assignment, those clauses that depend on the assignment are examined. In the case where a clause exists such that all but exactly one of the variables present in the clause have been assigned and the clause has not been satisfied by any of those assignments, the assignment to the final variable is forced and the assignment is made. The BCP function maintains of a worklist of assignments to process, each assignment potentially leading to new assignments that are added back to the worklist. The process continues until either the worklist is empty (no more implications) or a case is discovered in which a variable must simultaneously be set true and false (a logical conflict). A logical conflict initiates a backtrack.

A backtrack is a function known in the art for recovering from a conflict derived from BCP. In a backtrack operation, assignments are undone, beginning with the most recent and proceeding in order, until a point is reached at which the remaining assignments, and their logical implications, no longer violate the conflict clause derived from the conflict. The backtracking processes along the discrete level, known in the art as decision levels. Each decision level begins with a free choice of assignment and includes all of the assignments derived from that choice through the BCP process. Decision levels are numbered upward from 0, with assignments at level 0 being must-implications. A conflict inducing a backtrack past level 0 indicates the formula is unsatisfiable.

Figure 4:
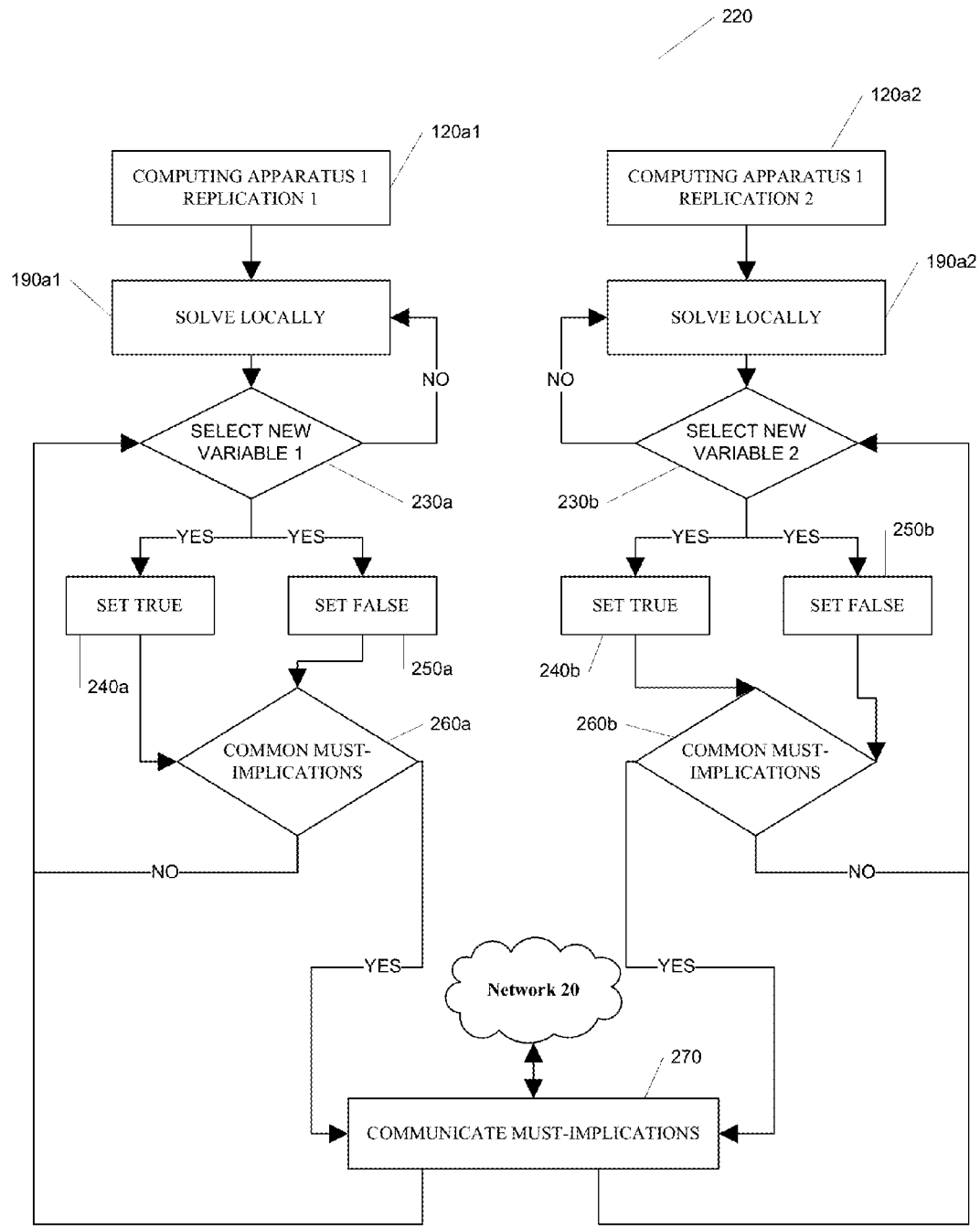
FIG. 4 illustrates an embodiment of a provided method.

An additional provided embodiment of a method 220 is illustrated in FIG. 4. In some embodiments, method 220 is a subset of the functions and operations of blocks 190(a) and 190(b). In this provided method, two copies of the replicated formula are assigned to the processing element in blocks 120(a)(1) and 120(a)(2). Flow continues to blocks 190(a)(1) and 190(a)(2) where the processing element attempts to solve the replications of the formula by the assigned solution tactic. Flow then continues to decision blocks 230(a) and 230(b) where it is determined if any additional variables exist in the formula. If additional variables exist, flow continues to blocks 240(a) and 240(b) where a variable is asserted TRUE, then to 250(a) and 250(b) where the same variable is asserted FALSE. In blocks 240(a), 240(b), 250(a), and 250(b), the implications of these assignments are additionally derived through Boolean Constraint Propagation. Flow then continues to decision blocks 260(a) and 260(b) where it is determined if a must-implication exists. If so, this must-implication is communicated in block 270 across the message-passing interface. If not, flow continues back to decision blocks 230(a) and 230(b) and the process iterates.

As is known in the art, a must-implication is a logical implication that exists when a particular clause takes on a logical state regardless of the assertion of TRUE or FALSE. In some embodiments, the solution tactics include deriving logical implications from the message-passing interface and using these implications in the process of deriving a solution. In some embodiments, the logical implication is a conflict clause; in others, it is a must-implication. In some embodiments, the process illustrated in method 220 is a partitioned process operating on different portions of the same formula. In these embodiments, the selection of a particular partition may be made based on a score assigned to a variable in another process. In other embodiments, the partitioning is accomplished based on the number of times a function has been called. In other embodiments, one of the solution tactics includes Boolean Constraint Propagation with backtracking and the deriving logical implications is performed when the number of backtracks exceeds a threshold.

Figure 5A:
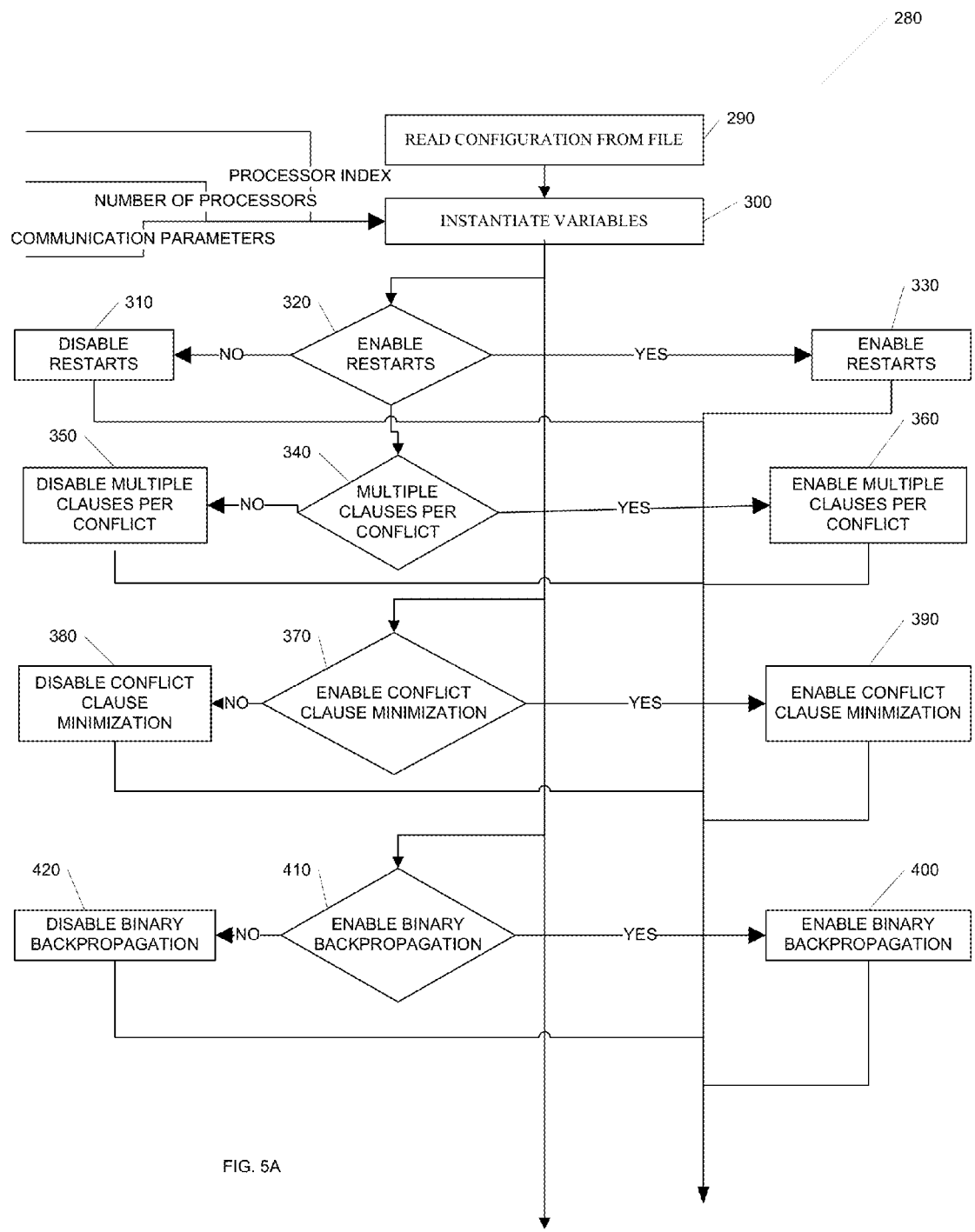
FIGS. 5a and 5b illustrate an embodiment of a provided method.
Figure 5B:
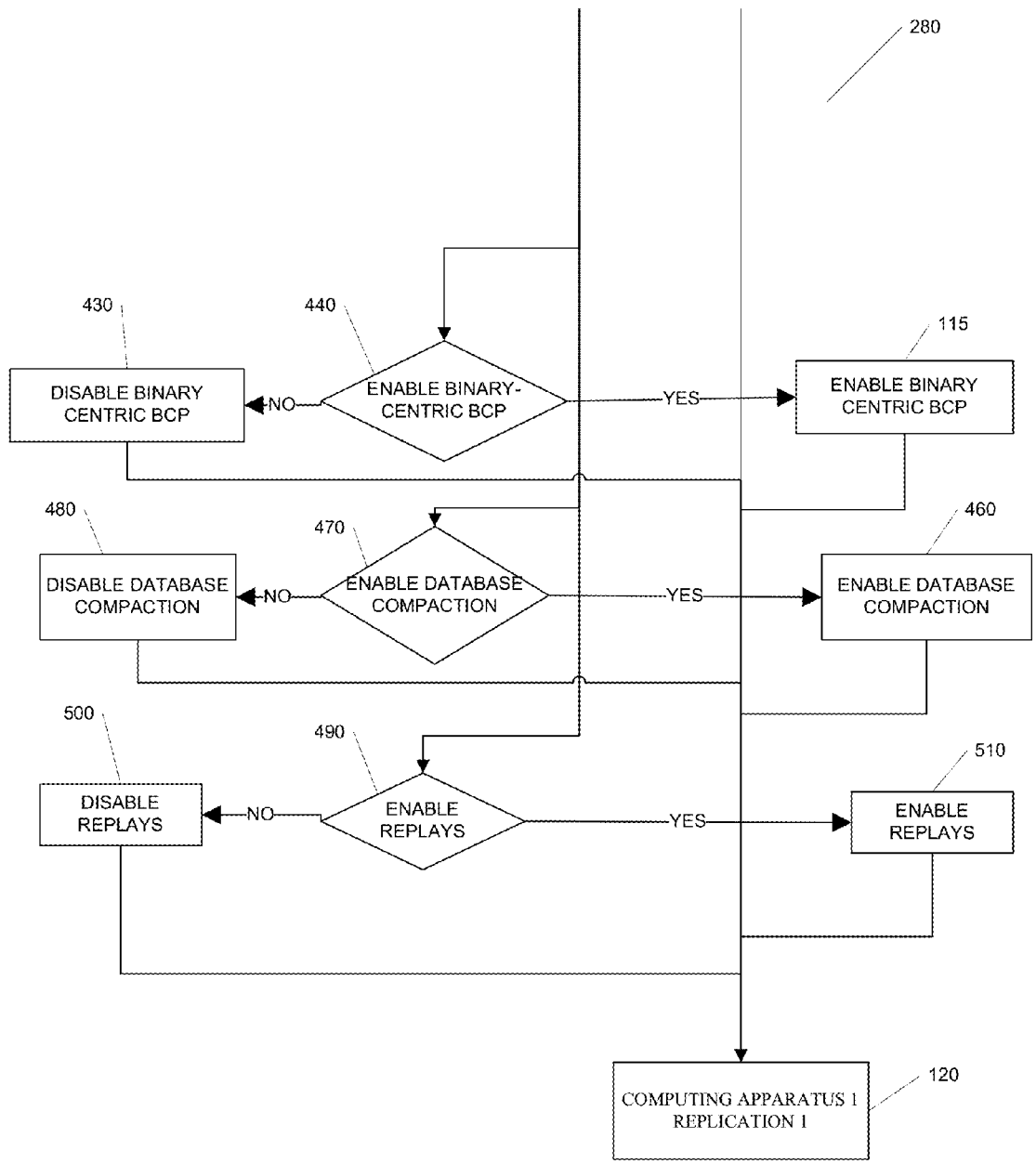

Another provided embodiment of a method 280 is illustrated in FIGS. 5a and 5b. In this embodiment, flow begins at block 290 where a processing element configuration is read from a file. Flow then continues to block 300 where variables are instantiated. In this embodiment, block 300 receives parameters such as processor index, the number of processors present, and various communication-related parameters. In no particular order, a number of decision blocks 320, 340, 370, 410, 440, 470, and 490 are performed. As illustrated, the decisions include whether restarts are enabled 320, whether multiple conflict clauses are enabled 340, whether conflict clause minimization is enabled 370, whether binary propagation is enabled 410, whether binary centric BCP is enabled 440, whether database compaction is enabled 470, and whether replays are enabled 490. In each instance, if the configuration read from the file in block 290 does not include the tested feature, flow continues to disable blocks 310, 350, 380, 420, 430, 480, and 500 where the particular feature is disabled. If the feature is to be enabled, flow continues to enable blocks 330, 360, 390, 400, 450, 460, and 510 where the particular feature is enabled. Flow then continues to block 120 for replication of the formula on the particular processing element.

Some embodiments of the present invention provide methods that allow processes using different solution tactics to communicate learned information with each other and to benefit from this information. The following pseudo code illustrates the communications between processes, and the activation and inactivation of the solution tactics.

```
processor_1( )
    assignments := empty
    reasons := empty
    stack := empty
    replay_stack := empty
    configure_processor_1( )
    WHILE remains_unassigned_variables(assignments)
        IF replay_stack is not empty THEN find_next_assignment(assignments,
        replay_stack)
        ELSE find_next_assignment(assignments, stack) // common knowledge
        END IF
        IF use_restarts and number_of_assignments reaches threshold1 THEN
        {
            increment threshold1
            replay_stack := empty
            // forget current assignments and stack
            backtrack_to_beginning(assignments, stack) // common knowledge
            GOTO WHILE LOOP
        } ELSE {
            conflict := empty
            IF use_binary_centric_bcp THEN conflict := binary_centric_bcp( )
            ELSE conflict := regular_bcp( ) // common knowledge
            END IF
            IF conflict is not empty THEN {
                replay_stack := empty
                IF use_binary_backpropagation
                THEN conflict := binary_backpropagation(stack, reasons, conflict)
                END IF
                IF use_conflict_minimization
                THEN conflict := minimize_conflict(conflict) // common
                knowledge
                END IF
                IF use_binary_backpropagation
                THEN conflict := binary_backpropagation(stack, reasons, conflict)
                END IF
            } END IF
            IF number_of_conflicts reaches threshold2 THEN {
                increment threshold2
                IF use_replay saved_stack := copy(stack) END IF
                // modulate amount of communication and exchange with
                neighbors
                // (possibly all processes
                exchange_information_with_neighbors( )
                // forget current assignments and stack
                backtrack_to_beginning(assignments, stack) // common knowledge
            } END IF
            IF number_of_conflicts reaches threshold3 THEN {
                increment threshold3
                IF use_recursive_learning THEN {
                    // forget current assignments and stack
                    backtrack_to_beginning(assignments, stack) // common
                    knowledge
                    perform_recursive_learning( ) // common knowledge
                    // modulate amount of communication and exchange with
```

-continued

```
            neighbors
            // (possibly all processes)
                exchange_information_with_neighbors( )
            } END IF
        } END IF
    } END IF
    END WHILE
terminate_all_processes( )
IF all_clauses_satisfied THEN RETURN assignments
ELSE RETURN empty
    END IF
processor_N( )
    assignments := empty
    reasons := empty
    stack := empty
    replay_stack := empty
    configure_processor_N( )
    WHILE remains_unassigned_variables(assignments)
        IF replay_stack is not empty THEN find_next_assignment(assignments,
            replay_stack)
        ELSE find_next_assignment(assignments, stack) // common knowledge
        END IF
        IF use_restarts and number_of_assignments reaches threshold1 THEN
{
            increment threshold1
            replay_stack := empty
            // forget current assignments and stack
            backtrack_to_beginning(assignments, stack) // common knowledge
            GOTO WHILE LOOP
        } ELSE {
            conflict := empty
            IF use_binary_centric_bcp THEN conflict := binary_centric_bcp( )
            ELSE conflict := regular_bcp( ) // common knowledge
            END IF
            IF conflict is not empty THEN {
                replay_stack := empty
                IF use_binary_backpropagation
                THEN conflict := binary_backpropagation(stack, reasons, conflict)
                END IF
                IF use_conflict_minimization
                THEN conflict := minimize_conflict(conflict) // common
                knowledge
                END IF
                IF use_binary_backpropagation
                THEN conflict := binary_backpropagation(stack, reasons, conflict)
                END IF
            } END IF
            IF number_of_conflicts reaches threshold2 THEN {
                increment threshold2
                IF use_replay saved_stack := copy(stack) END IF
                // modulate amount of communication and exchange with
                neighbors
                // (possibly all processes)
                exchange_information_with_neighbors( )
                // forget current assignments and stack
                backtrack_to_beginning(assignments, stack) // common knowl-
edge
            } END IF
            IF number_of_conflicts reaches threshold3 THEN {
                increment threshold3
                IF use_recursive_learning THEN {
                    // forget current assignments and stack
                    backtrack_to_beginning(assignments, stack) // common
                    knowledge
                    perform_recursive_learning( ) // common knowledge
                    // modulate amount of communication and exchange with
                    neighbors
                    // (possibly all processes)
                    exchange_information_with_neighbors( )
                } END IF
            } END IF
        } END IF
    END WHILE
terminate_all_processes( )
IF all_clauses_satisfied THEN RETURN assignments
ELSE RETURN empty
END IF
```

In some embodiments, these options are related to a decision procedure such as a solution tactic for a Satisfiability problem. In other embodiments, the process of evaluating if a particular option is to be enabled includes assigning that option a key and associating that key to an expression of zero or more variables that can be evaluated by a processing element. In some embodiments, this expression is an arithmetic expression that supports the modulus operation. In others, it supports if-then and if-then-else conditionals. In other embodiments, these expressions are evaluated separately by each processing element involved in solving the formula. In other embodiments, this expression is in postfix notation. In still further embodiments, these variables are specific to the process being instantiated. Additional embodiments include where these variables include a unique index of the process being instantiated, a value related to the number of processes being instantiated, and a value related to the capabilities of the platform on which the process is being instantiated. In other embodiments, these variables are stored to a file accessible to other processing elements.

The enabling of multiple conflict clauses is known in the art as the technique by which BCP is allowed to continue past the discovery of a first conflict to determine if additional conflicts are also implied. A conflict clause is then generated for each. Conflict clause minimization is a known in the art as an optimization technique for reducing the number of literals contained in a conflict clause. Binary back-propagation is a technique for optimizing a conflict clause using implications derived from binary clauses (original or conflict). Binary-centric BCP is a method for separating in the BCP process the handling of binary and non-binary clauses. Database compaction is known in the art as a technique by which the set of clauses being considered is reduced by removing clauses satisfied by must-implications or conflict clauses that are no longer active. The enabling of replays is a technique wherein decisions that have been backtracked over as a result of finding a conflict but that may be unrelated to the conflict, are retested after the backtrack.

In still further embodiments, the parametric space contains a parameter such as a seed to a random number generator, a parameter related to a choice of tactics used by the decision procedure, a parameter related to options affecting the behavior of the decision procedure within a tactic, and a parameter related to options affecting the frequency of functions called within a tactic. In still further embodiments, the choice of instantiation includes distributing all possible combinations of choices of instantiation to the plurality of processing elements. In still further embodiments, the parametric space of options can be explored dynamically by at least one processing element during execution.

Figure 6:
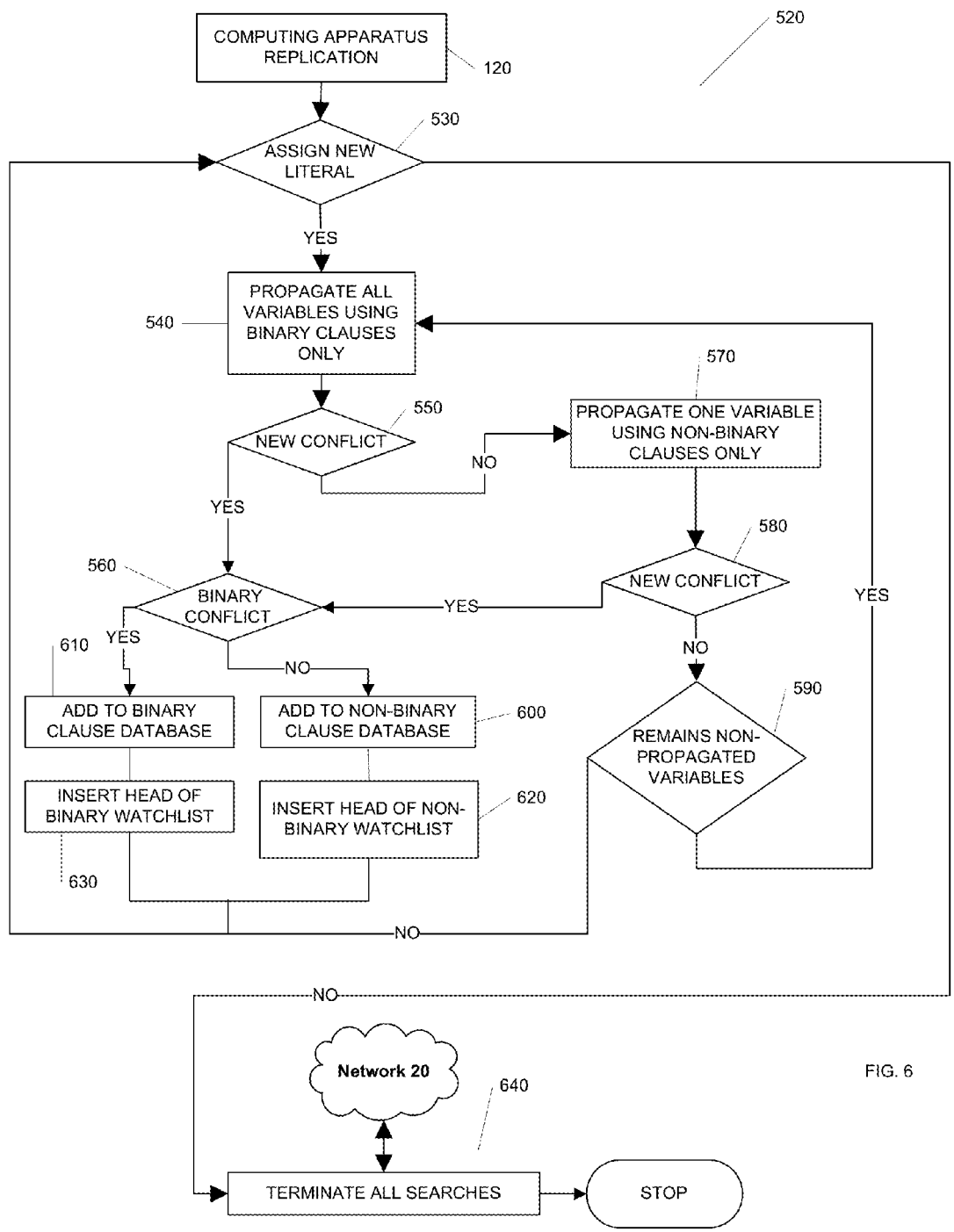
FIG. 6 illustrates an embodiment of a provided method.

Another provided embodiment of a method 520 is illustrated in FIG. 6. In this method, the formula is replicated and assigned to a particular processing element in block 120. Flow continues to decision block 530 where it is determined if additional unassigned literals exist in the formula. If so, one is chosen and an assignment made. Flow continues to block 540 where all variables are propagated using binary clauses only. In decision block 550 it is determined if a conflict exists, if no conflict exists flow continues to block 570 where one variable is propagated using non-binary clauses only. Flow then continues to decision block 580 where it is again determined if a conflict exists. If no conflict exists, flow continues back to decision block 530 and the process iterates. Returning back to decision block 550, if a conflict is found, flow continues to decision block 560. Additionally, if a conflict is found in decision block 580 flow continues to decision block 560. At block 560 it is determined if the conflict is a binary clause. If the conflict is a binary clause, flow continues to block 610 where it is added to the binary clause database and in block 630 put on the head of the binary watch list. Flow then continues back to decision block 530. If in decision block 560 it is determined that the clause is not binary, flow continues to block 600 where it is added to the non-binary database and put on the head of the non-binary watch list in block 620. Flow then continues back to decision block 530 and the process iterates until decision block 530 determines that there are no unassigned literals. Flow then continues to block 640 where all searches are terminated.

In some embodiments, a data structure is used that maintains separation between the binary and non-binary clauses in the formula. In other embodiments the data structure includes different insertion points for binary and non-binary clauses. In many embodiments, new assignments are deduced from the watch lists. The concept of watch lists is of common knowledge to the engineer knowledgeable in the art of SAT solving. The intuition is to constantly monitor 2 unassigned literals from every clause. When a clause that is not yet satisfied has only 1 unassigned literal left, this literal must be satisfied. Watch lists are a structure to efficiently track for each literal, the list of clauses that can influence the literals assignment. In other embodiments, Binary Constraint Propagation is performed on all binary clauses before the non-binary clauses. In other embodiments, a test for a must-implication is additionally performed and a determination made about the binary nature of a clause based on the must-implication. In other embodiments, a data structure includes a field that is used to indicate whether a clause is binary or non-binary.

The pseudo code below shows how an implementation of binary centric BCP gives preference to binary clauses by first performing resolution on the binary watchlists only.

```
// Input parameters:
// - stack: the assignment stack
// - reasons: a structure that maps assigned literals to the clause that
// forced the assignment
// - b_wls the watchlists for binary clauses, indexed by letarals
// - nb_wls the watchlists for non-binary clauses, indexed by literals
// - assignment: the current decision literal
// Output:
// - a conflict if a conflict is found or NULL if the assignments are all
consistent
binary_centric_BCP(stack, reasons, b_wls, nb_wls, assignment):
    FORALL clause in b_wls[not(assignment)]
        other_literal = get_other_literal(clause, assignment)
        IF is_unassigned(other_literal) THEN {
            assign(other_literal)
            return binary_centric_BCP(stack, reasons, b_wls, nb_wls,
                other_literal)
        } ELSE IF is_already_assigned(other_literal) THEN {
            IF is_correctly_assigned(other_literal) THEN {
                CONTINUE FORALL
            } ELSE {
                conflict = generate_binary_conflict(clause, other_literal)
                RETURN conflict
            } END IF
        } END IF
    } END FORALL
    RETURN regular_BCP(stack, reasons, b_wls, nb_wls, assignment) //
    common knowledge
```

The high-level solver function inserts binary and non-binary conflicts in the proper watch lists.

```
processor( )
    assignments := empty
    reasons :=empty
    stack := empty
    replay_stack := empty
    configure_processor( )
    WHILE remains_unassigned_variables(assignments)
        IF replay_stack is not empty THEN find_next_assignment(assignments,
            replay_stack)
        ELSE find_next_assignment(assignments, stack) // common knowledge
        END IF
        IF use_restarts and number_of_assignments reaches threshold1 THEN
        {
            increment threshold1
            replay_stack := empty
            // forget current assignments and stack
            backtrack_to_beginning(assignments, stack) // common knowledge
            GOTO WHILE LOOP
        } ELSE {
            conflict := empty
            IF use_binary_centric_bcp THEN {
                conflict := binary_centric_bcp( )
                IF is_binary(conflict) THEN {
                    insert_at_head_of_binary_watchlist(conflict)
                } ELSE {
                    insert_at_head_of_non_binary_watchlist(conflict)
                } END IF
            } ELSE conflict := regular_bcp( ) // common knowledge
            END IF
            IF conflict is not empty THEN {
                replay_stack := empty
                IF use_binary_backpropagation
                THEN conflict := binary_backpropagation(stack, reasons, conflict)
                END IF
                IF use_conflict_minimization
                THEN conflict := minimize_conflict(conflict) // common
                knowledge
                END IF
                IF use_binary_backpropagation
                THEN conflict := binary_backpropagation(stack, reasons, conflict)
                END IF
            } END IF
            IF number_of_conflicts reaches threshold2 THEN {
                increment threshold2
                IF use_replay saved_stack := copy(stack) END IF
                // modulate amount of communication and exchange with
                neighbors
                // (possibly all processes)
                exchange_information_with_neighbors( )
                // forget current assignments and stack
                backtrack_to_beginning(assignments, stack) // common knowledge
            } END IF
            IF number_of_conflicts reaches threshold3 THEN {
                increment threshold3
                IF use_recursive_learning THEN {
                    // forget current assignments and stack
                    backtrack_to_beginning(assignments, stack) // common
                    knowledge
                    perform_recursive_learning( ) // common knowledge
                    // modulate amount of communication and exchange with
                    neighbors
                    // (possibly all processes)
                    exchange_information_with_neighbors( )
                } END IF
            } END IF
        } END IF
    END WHILE
    terminate_all_processes( )
    IF all_clauses_satisfied THEN RETURN assignments
    ELSE RETURN empty
```

Figure 7:
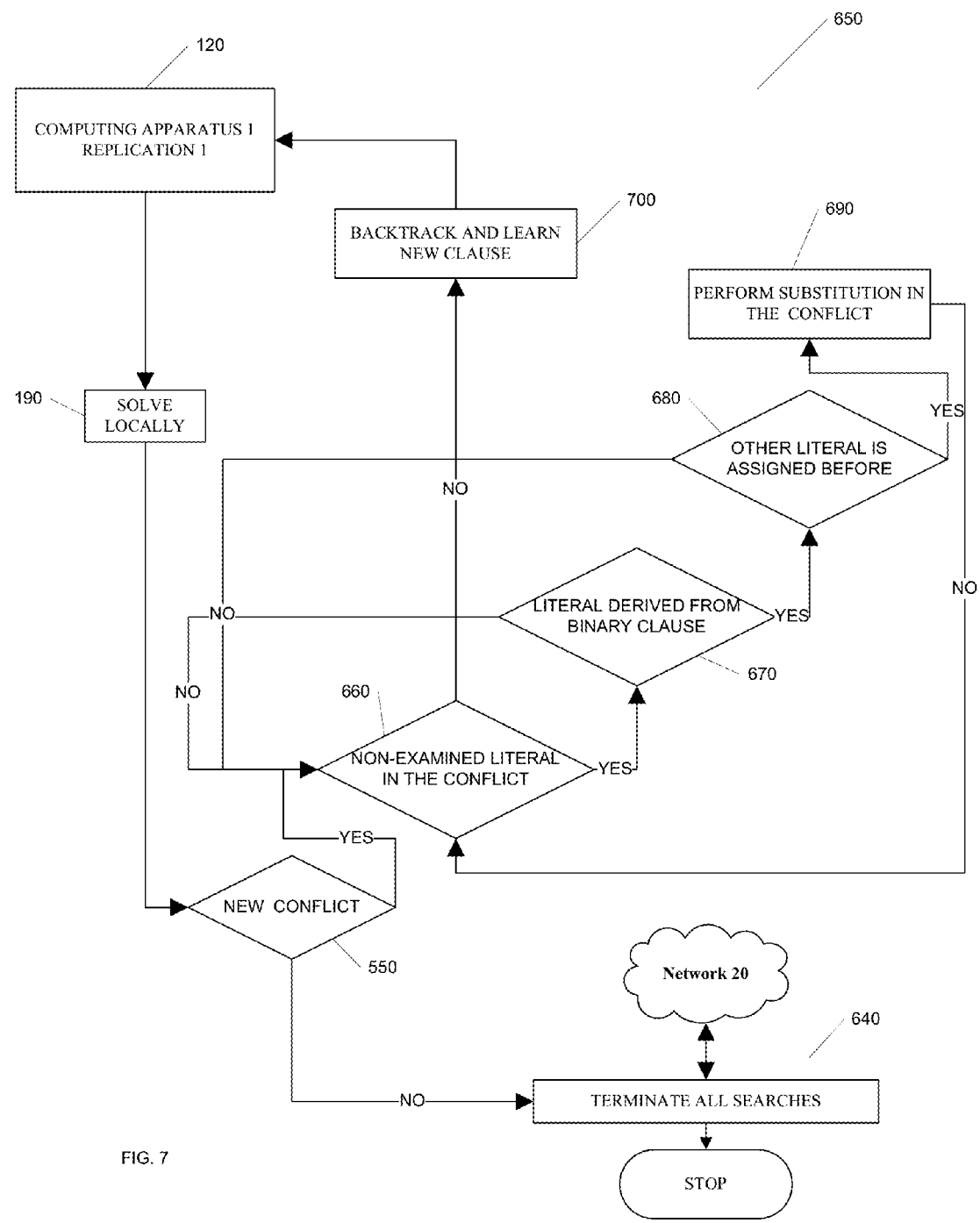
FIG. 7 illustrates an embodiment of a provided method.

Another embodiment of a provided method 650 is illustrated in FIG. 7. In this embodiment, the formula is replicated and assigned to a particular processing element in block 120. Flow then continues to block 190 where the particular solution tactic for this processing element is accomplished. Flow continues to block decision 550, where it is determined if a conflict exists. If no conflicts exist, flow continues to block 640 where all searches are terminated. As with other embodiments, the termination and other information can, be communicated over a network 20, or other message passing interface, to other processing elements. If a conflict is found in decision block 550 flow proceeds to decision block 660 where it is determined an unexamined literal exists in the conflict clause. If not flow continues to block 700 where backtracking is performed and the new clause added to learned clauses. Flow then continues to block 120. If at decision block 660 it is determined that there is a non-examined literal in the conflict clause, flow proceeds to decision block 670 where it is determined if the literal was derived from a binary clause. If not, flow returns to block 660. If it is determined that the literal is derived from a binary clause, flow continues to block 680 where it is determined if another literal has a previous assignment. If so, flow continues to block 690 where the second literal is substituted into the conflict clause and flow continues back to 660. If the second literal was not previously assigned, flow continues back to 660.

In some embodiments, the first clause is a binary clause in others it is not. Additional embodiments include embodiments where the second clause is binary and included the negated literal under consideration in the first clause. Additional embodiments include embodiments where one-to-one substitution is performed on all literals identified within a particular conflict clause. Since this provided method is independent from routine conflict clause minimization it can be performed in conjunction with this minimization occurring either before or after the minimization.

Conflict clause minimization is known in the art and is a technique used to make the learned conflict as small as possible. Various aspects of the present invention additionally perform substitutions of literals in the generated learned clauses. An example of these substitutions is seen in the below pseudo code.

```
// Input parameters:
// - stack: the assignment stack
// - reasons: a structure that maps assigned literals to the clause that
// forced the assignment
// - conflict: a list of literals forming a
// Output parameter:
// - result: the list of literals forming the resulting conflict
binary_backpropagation(stack, reasons, conflict):
    WHILE not done
        changed := FALSE
        FORALL literal in conflict
            reason_clause := reason_for_assignment(reasons, literal)
            IF length(reason_clause) equals 2 THEN {
                other_literal := get_other_literal(reason_clause, literal)
                IF level_in_stack(other_literal) < level_in_stack(literal) THEN {
                    sign := 1
                    IF literal * other_literal less than 0 THEN sign := -1 END IF
                    replace_literal_in_conflict(conflict, literal, other_literal * sign)
                    changed := TRUE
                } END IF
            } END IF
        END FORALL
    END WHILE
    result := remove_duplicated_literals(conflict)
    RETURN result
```

It is to be understood that the aspects described herein can be implemented by hardware, software, firmware, middleware, microcode, or any combination thereof. When the systems and/or methods are implemented in software, firmware, middleware or microcode, program code or code segments, they can be stored in a machine-readable medium, such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules (e.g., procedures, functions, and so on) that perform the functions described herein. The software codes can be stored in memory units and executed by processors. The memory unit can be implemented within the processor or external to the processor, in which case it can be communicatively coupled to the processor via various means as is known in the art.

Thus, it is seen that methods and an apparatus for distributed decision processing are provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims.

What is claimed is:

1. A method of solving a logical decision problem in a multi-processing element custom computing apparatus, the method comprising:

receiving a formula in a memory;

generating, a plurality of replications of the formula, the number of replications in the plurality related to a number of processing elements in the custom computing apparatus;

assigning one of the plurality of replications of the formula to a first processing element;

assigning a second replication of the plurality to a second processing element;

configuring the first processing element to solve the formula using a first solution tactic and the second processing element to solve the formula using a second solution tactic; and enabling a message passing interface between the first processor and the second processor, wherein the first and second processing elements are configured to incorporate information received from the message passing interface into its solution tactic.

2. The method of claim 1, wherein the formula has a propositional logic component.

3. The method of claim 2, wherein either the first solution tactic or the second solution tactic comprises a search and, decisions made in the course of the search can be saved in the event of a backtrack.

4. The method of claim 3, wherein either the first solution tactic or the second solution tactic further comprises a function for replaying decisions made from the backtrack.

5. The method of claim 4, wherein the backtrack is induced by learned information received on the message passing interface.

6. The method of claim 2, wherein at least one of the first or second solution tactic comprises a tactic selected from the group consisting of: a restarts enabled tactic, a number of learned clauses per conflict tactic, a conflict clause minimization enabled tactic, a decision replay enabled tactic, a binary back-propagation enabled tactic, a database compaction enabled tactic, and a binary-centric Boolean Constraint Propagation enabled tactic.

7. The method of claim 2, wherein the information received is a subset of the set of conflict clauses derived by the execution of either the first or the second solution tactic.

8. The method of claim 2, wherein the information received is a subset of the set of must-implications derived by the execution of either the first or the second solution tactic.

9. The method of claim 1, wherein the information received comprises an aggregation of messages containing learned information, the first and second processing elements further configured to control the occurrence and frequency of send communications on the message passing interface.

10. The method of claim 9, wherein the configuration for the first processing element and the second processing element to control the occurrence and frequency of send communications on the message passing interface are different.

11. The method of claim 9, wherein the configuration for the first processing element or the configuration for the second processing element to control the occurrence and frequency of send communications on the message passing interface further comprises a configuration to adapt the frequency of send communications based on the communication bandwidth of the message passing interface.

12. The method of claim 2, wherein at least one of the first and the second solution tactics comprise deriving logical implications from information received from the message passing interface.

13. The method of claim 12 wherein the deriving logical implications further comprises:
assigning a variable in the formula a TRUE state;
producing a first set of implications through Boolean constraint propagation of the TRUE state assignment;
assigning the variable a FALSE state;
producing a second set of implications through Boolean constraint propagation of the FALSE state assignment; and
assigning states common to both the first set and the second set of implications.

14. The method of claim 13, further comprising:
partitioning the formula into a set of variables; and
selecting the variable for assignment from a score related to the variable.

15. The method of claim 14, further comprising calculating the number of times a function has been called and restricting the partition of the variables based on this calculation.

16. The method of claim 12 wherein at least one of the first or the second solution tactic comprises Boolean constraint propagation with backtracking, the deriving logical implications is performed when the number of backtracks exceeds a threshold.

17. The method of claim 12 further comprising sending the logical implications across the message passing interface.

18. The method of claim 17, wherein the logical implication is an implication selected from a group comprising a must-implication and a conflict clause.

19. The method of claim 2, wherein the propositional logic component comprises binary and non-binary clauses, the method further comprising performing Boolean constraint propagation that discriminates between the binary and non-binary clauses.

20. The method of claim 19, further comprising forming a data structure that maintains separation between the binary and non-binary clauses.

21. The method of claim 20, wherein the data structure comprises different insertion points for binary and non-binary clauses.

22. The method of claim 19, wherein the formula comprises a set of clauses each of the set of clauses comprising at least one literal, the method further comprising:
forming a list of watched literals from the set of clauses;
performing Boolean constraint propagation on each watched literal;
deducing new assignments from the Boolean constraint propagation; and
implying new assignments from the Boolean constraint propagation.

23. The method of claim 19, further comprising performing Binary constraint propagation on all binary clauses in the propositional logic component before performing Boolean constraint propagation on the non-binary clauses in the propositional logic component.

24. The method of claim 19, further comprising determining if a non-binary clause becomes a binary clause because of a must-implication.

25. The method of claim 24, wherein the clause comprises a field, the value of the field indicating if the clause is a binary or a non-binary clause.

26. The method of claim 2 wherein the propositional logic component comprises binary and non-binary clauses, the method further comprising performing conflict clause generation that distinguishes between binary and non-binary clauses.

27. The method of claim 26, further comprising identifying a candidate conflict clause and performing one-to-one substitutions on all literals within the identified conflict clause.

28. The method of claim 26, further comprising:
(a) identifying a first conflict clause;
(b) identifying a first literal in the first conflict clause;
(c) identifying a second binary conflict clause, the second binary clause containing the negated first literal; and
(d) replacing a literal in the first binary conflict clause if a second literal within the second binary conflict clause has a state assignment before the first literal in the first binary conflict clause.

29. The method of claim 28, wherein (a) through (d) is performed before Conflict clause minimization.

30. The method of claim 28, wherein (a) through (d) is performed after conflict clause minimization.

31. A computerized method comprising:
defining a parametric space of options available to each of a plurality of processing elements, the options related to a decision procedure;
distributing to each of the plurality of processing elements a choice of instantiation, the choice of instantiation related to the options in the parametric space; and
separately instantiating a subset of the options in the parametric space for each of the plurality of processing elements based on the choice of instantiation.

32. The method of claim 31, wherein the decision procedure is a Boolean Satisfiability (SAT) solver.

33. The method of claim 31, further comprising associating a plurality of keys each of the plurality representing one of the parametric space of options to an expression that can that can be evaluated to the choice of value for that option.

34. The method of claim 33, further comprising evaluating the expression separately by each of the plurality of processing elements.

35. The method of claim 33, wherein the expression is an arithmetic expression containing zero or more variables.

36. The method of claim 35, wherein the expression is in postfix notation.

37. The method of claim 35, wherein the expression contains variables whose interpretation in specific to the process being instantiated.

38. The method of claim 37, wherein one of the variables is associated with a parameter selected from a group consisting of: a unique index of the process being instantiated, a value related to the number of processes being instantiated, a value related to the capabilities of the platform on which the process is being instantiated.

39. The method of claim 33, further comprising storing the association to a file accessible by each of the plurality of processing elements.

40. The method of claim 33, wherein the arithmetic expression comprises support for an operation selected from a group consisting of: a modulus operation, an if-then conditional operation and an if-then-else conditional operation.

41. The method of claim 31, wherein the parametric space comprises a parameter selected from a group consisting of: a seed to a random number generator; a parameter related to a choice of tactics used by the decision procedure; a parameter related to options affecting the behavior of the decision procedure within a tactic, a parameter related to options affecting the frequency of functions called within a tactic.

42. The method of claim 31, wherein the distribution of choices of instantiation comprises distributing all possible combinations of choices of instantiation to the plurality of processing elements.

43. The method of claim 31, further comprising specifying a parametric space of options that can be explored dynamically by at least one processing element during execution.

44. A custom computing apparatus for solving a logical decision problem in a multi-processing element custom computing apparatus comprising:
a plurality of processing elements;
a memory in communication with the plurality of processing elements, the memory comprising a set of processor executable instructions such that when executed by one or more processing elements configure the custom computing apparatus to:
receive a formula in the memory;
generate, a plurality of replications of the formula, the number of replications in the plurality related to the number of processing elements in the custom computing apparatus;
assign one of the plurality of replications of the formula to a first processing element of the plurality;
assign a second replication of the plurality to a second processing element of the plurality;
configure the first processing element to solve the formula using a first solution tactic and the second processing element to solve the formula using a second solution tactic; and
enable a message passing interface between the first processor and the second processor, wherein the first and second processing elements are configured to incorporate information received from the message passing interface into its solution tactic.

45. The custom computing apparatus of claim 44, wherein the formula has a propositional logic component.

46. The custom computing apparatus of claim 45, wherein either the first solution tactic or the second solution tactic comprises a search and, decisions made in the course of the search can be saved in the event of a backtrack.

47. The custom computing apparatus of claim 46, wherein either the first solution tactic or the second solution tactic further comprises a function for replaying decisions made from the backtrack.

48. The custom computing apparatus of claim 47, wherein the backtrack is induced by learned information received on the message passing interface.

49. The custom computing apparatus of claim 45, wherein at least one of the first or second solution tactic comprises a tactic selected from the group consisting of: a restarts enabled tactic, a number of learned clauses per conflict tactic, a conflict clause minimization enabled tactic, a decision replay enabled tactic, a binary back-propagation enabled tactic, a database compaction enabled tactic, and a binary-centric Boolean Constraint Propagation enabled tactic.

50. The custom computing apparatus of claim 45, wherein the information received is a subset of the set of conflict clauses derived by the execution of either the first or the second solution tactic.

51. The custom computing apparatus of claim 45, wherein the information received is a subset of the set of must-implications derived by the execution of either the first or the second solution tactic.

52. The custom computing apparatus of claim 44, wherein the information received comprises an aggregation of messages containing learned information, the first and second processing elements further configured to control the occurrence and frequency of send communications on the message passing interface.

53. The custom computing apparatus of claim 52, wherein the configuration for the first processing element and the second processing element to control the occurrence and frequency of send communications on the message passing interface are different.

54. The custom computing apparatus of claim 52, wherein the configuration for the first processing element or the configuration for the second processing element to control the occurrence and frequency of send communications on the message passing interface further comprises a configuration to adapt the frequency of send communications based on the communication bandwidth of the message passing interface.

55. The custom computing apparatus of claim 45, wherein at least one of the first and the second solution tactics comprise a solution tactic configured to derive logical implications from information received from the message passing interface.

56. The custom computing apparatus of claim 55, wherein the configuration to derive logical implications further comprises a configuration to:
assign a variable in the formula a TRUE state;
produce a first set of implications through Boolean constraint propagation of the TRUE state assignment;
assign the variable a FALSE state;
produce a second set of implications through Boolean constraint propagation of the FALSE state assignment; and
assign states common to both the first set and the second set of implications.

57. The custom computing apparatus of claim 56, wherein the configuration further comprises a configuration to:
partition the formula into a set of variables; and
select the variable for assignment from a score related to the variable.

58. The custom computing apparatus of claim 57, wherein the configuration further comprises a configuration to calculate the number of times a function has been called and restrict the partition of the variables based on this calculation.

59. The custom computing apparatus of claim 55, wherein at least one of the first or the second solution tactic comprises Boolean constraint propagation with backtracking, the configuration to derive logical implications is performed when the number of backtracks exceeds a threshold.

60. The custom computing apparatus of claim 55, wherein the configuration further comprises a configuration to send the logical implications across the message passing interface.

61. The custom computing apparatus of claim 60, wherein the logical implication is an implication selected from a group comprising a must-implication and a conflict clause.

62. The custom computing apparatus of claim 45, wherein the propositional logic component comprises binary and non-binary clauses, the configuration further comprising a configuration to perform Boolean constraint propagation that discriminates between the binary and non-binary clauses.

63. The custom computing apparatus of claim 62, wherein the configuration further comprises a configuration to form a data structure that maintains separation between the binary and non-binary clauses.

64. The custom computing apparatus of claim 63, wherein the data structure comprises different insertion points for binary and non-binary clauses.

65. The custom computing apparatus of claim 62, wherein the formula comprises a set of clauses each of the set of clauses comprising at least one literal, the configuration further comprising a configuration to:
form a list of watched literals from the set of clauses;
perform Boolean constraint propagation on each watched literal;
deduce new assignments from the Boolean constraint propagation; and
imply new assignments from the Boolean constraint propagation.

66. The custom computing apparatus of claim 62, wherein the configuration further comprises a configuration to perform Binary constraint propagation on all binary clauses in the propositional logic component before performing Boolean constraint propagation on the non-binary clauses in the propositional logic component.

67. The custom computing apparatus of claim 62, wherein the configuration further comprises a configuration to determine if a non-binary clause becomes a binary clause because of a must-implication.

68. The custom computing apparatus of claim 67, wherein the clause comprises a field, the value of the field indicating if the clause is a binary or a non-binary clause.

69. The custom computing apparatus of claim 45, wherein the propositional logic component comprises binary and non-binary clauses, the configuration further comprising a configuration to perform conflict clause generation that distinguishes between binary and non-binary clauses.

70. The custom computing apparatus of claim 69, wherein the configuration further comprises a configuration to identify a candidate conflict clause and perform one-to-one substitutions on all literals within the identified conflict clause.

71. The custom computing apparatus of claim 69, wherein the configuration further comprises a configuration to:
(a) identify a first conflict clause;
(b) identify a first literal in the first conflict clause;
(c) identify a second binary conflict clause, the second binary clause containing the negated first literal; and
(d) replace a literal in the first conflict clause if a second literal within the second binary conflict clause has a state assignment before the first literal in the first binary conflict clause.

72. The custom computing apparatus of claim 71, wherein the configuration to perform (a) through (d) is performed before conflict clause minimization.

73. The custom computing apparatus of claim 71, wherein the configuration to perform (a) through (d) is performed after conflict clause minimization.

74. A custom computing apparatus comprising:
a plurality of processing elements; and
a memory communicating with the plurality of processing elements, wherein the memory comprises a set of processor executable instructions that when executed by one or more of the processing elements configured the custom computing apparatus to:
define a parametric space of options available to each of the plurality of processing elements, the options related to a decision procedure;
distribute to each of the plurality of processing elements a choice of instantiation, the choice of instantiation related to the options in the parametric space; and
separately instantiate a subset of the options in the parametric space for each of the plurality of processing elements based on the choice of instantiation.

75. The custom computing apparatus of claim 74, wherein the decision procedure is a Boolean Satisfiability (SAT) solver.

76. The custom computing apparatus of claim 74, wherein the configuration further comprises a configuration to associate a plurality of keys each of the plurality representing one of the parametric space of options to an expression that can that can be evaluated to the choice of value for that option.

77. The custom computing apparatus of claim 76, wherein the configuration further comprises a configuration to evaluate the expression separately by each of the plurality of processing elements.

78. The custom computing apparatus of claim 76, wherein the expression is an arithmetic expression containing zero or more variables.

79. The custom computing apparatus of claim 78, wherein the expression is in postfix notation.

80. The custom computing apparatus of claim 73, wherein the expression contains variables whose interpretation in specific to the process being instantiated.

81. The custom computing apparatus of claim 80, wherein one of the variables is associated with a parameter selected from a group consisting of: a unique index of the process being instantiated, a value related to the number of processes being instantiated, a value related to the capabilities of the platform on which the process is being instantiated.

82. The custom computing apparatus of claim 81, wherein the configuration further comprises a configuration to store the association to a file accessible by each of the plurality of processing elements.

83. The custom computing apparatus of claim 76, wherein the arithmetic expression comprises support for an operation selected from a group consisting of a modulus operation, an if-then conditional operation and an if-then-else conditional operation.

84. The custom computing apparatus of claim 74, wherein the parametric space comprises a parameter selected from a group consisting of: a seed to a random number generator; a parameter related to a choice of tactics used by the decision procedure; a parameter related to options affecting the behavior of the decision procedure within a tactic, a parameter related to options affecting the frequency of functions called within a tactic.

85. The custom computing apparatus of claim 74, wherein the configuration to distribute choices of instantiation comprises a configuration to distribute all possible combinations of choices of instantiation to the plurality of processing elements.

86. The custom computing apparatus of claim 74, wherein the configuration further comprising a configuration to specify a parametric space of options that can be explored dynamically by at least one processing element during execution.

87. A computer software product for solving a logical decision problem in a multi-processing element custom computing apparatus, the product comprising:
    at least one of a non-transitory computer storage medium containing a set of processor executable instructions and a physical connection in electronic communication with a storage medium, supplying thereto the set of processor executable instructions, that when executed by one or more processors of a plurality of processing elements configure a custom computing apparatus to:
    receive a formula in a memory, the memory in communication with the plurality of processing elements;
    generate, a plurality of replications of the formula, the number of replications in the plurality related to the number of processing elements in the custom computing apparatus;
    assign one of the plurality of replications of the formula to a first processing element of the plurality;
    assign a second replication of the plurality to a second processing element of the plurality;
    configure the first processing element to solve the formula using a first solution tactic and the second processing element to solve the formula using a second solution tactic; and
    enable a message passing interface between the first processor and the second processor, wherein the first and second processing elements are configured to incorporate information received from the message passing interface into its solution tactic.

88. The computer software product of claim 87, wherein the formula has a propositional logic component.

89. The computer software product of claim 88, wherein either the first solution tactic or the second solution tactic comprises a search and, decisions made in the course of the search can be saved in the event of a backtrack.

90. The computer software product of claim 89, wherein either the first solution tactic or the second solution tactic further comprises a function for replaying decisions made from the backtrack.

91. The computer software product of claim 90, wherein the backtrack is induced by learned information received on the message passing interface.

92. The computer software product of claim 88, wherein at least one of the first or second solution tactic comprises a tactic selected from the group consisting of: a restarts enabled tactic, a number of learned clauses per conflict tactic, a conflict clause minimization enabled tactic, a decision replay enabled tactic, a binary back-propagation enabled tactic, a database compaction enabled tactic, and a binary-centric Boolean Constraint Propagation enabled tactic.

93. The computer software product of claim 88, wherein the information received is a subset of the set of conflict clauses derived by the execution of either the first or the second solution tactic.

94. The computer software product of claim 88, wherein the information received is a subset of the set of must-implications derived by the execution of either the first or the second solution tactic.

95. The computer software product of claim 87, wherein the information received comprises an aggregation of messages containing learned information, the first and second processing elements further configured to control the occurrence and frequency of send communications on the message passing interface.

96. The computer software product of claim 95, wherein the configuration for the first processing element and the second processing element to control the occurrence and frequency of send communications on the message passing interface are different.

97. The computer software product of claim 95, wherein the configuration for the first processing element or the configuration for the second processing element to control the occurrence and frequency of send communications on the message passing interface further comprises a configuration to adapt the frequency of send communications based on the communication bandwidth of the message passing interface.

98. The computer software product of claim 88, wherein at least one of the first and the second solution tactics comprise a solution tactic configured to derive logical implications from information received from the message passing interface.

99. The computer software product of claim 98, wherein the configuration to derive logical implications further comprises a configuration to:
    assign a variable in the formula a TRUE state;
    produce a first set of implications through Boolean constraint propagation of the TRUE state assignment;
    assign the variable a FALSE state;
    produce a second set of implications through Boolean constraint propagation of the FALSE state assignment; and
    assign states common to both the first set and the second set of implications.

100. The computer software product of claim 99, wherein the configuration further comprises a configuration to:
    partition the formula into a set of variables; and
    select the variable for assignment from a score related to the variable.

101. The computer software product of claim 100, wherein the configuration further comprises a configuration to calculate the number of times a function has been called and restrict the partition of the variables based on this calculation.

102. The computer software product of claim 98, wherein at least one of the first or the second solution tactic comprises Boolean constraint propagation with backtracking, the configuration to derive logical implications is performed when the number of backtracks exceeds a threshold.

103. The computer software product of claim 98, wherein the configuration further comprises a configuration to send the logical implications across the message passing interface.

104. The computer software product of claim 103, wherein the logical implication is an implication selected from a group comprising a must-implication and a conflict clause.

105. The computer software product of claim 88, wherein the propositional logic component comprises binary and non-binary clauses, the configuration further comprising a configuration to perform Boolean constraint propagation that discriminates between the binary and non-binary clauses.

106. The computer software product of claim 105, wherein the configuration further comprises a configuration to form a data structure that maintains separation between the binary and non-binary clauses.

107. The computer software product of claim 106, wherein the data structure comprises different insertion points for binary and non-binary clauses.

108. The computer software product of claim 105, wherein the formula comprises a set of clauses each of the set of clauses comprising at least one literal, the configuration further comprising a configuration to:
- form a list of watched literals from the set of clauses;
- perform Boolean constraint propagation on each watched literal;
- deduce new assignments from the Boolean constraint propagation; and
- imply new assignments from the Boolean constraint propagation.

109. The computer software product of claim 105, wherein the configuration further comprises a configuration to perform Binary constraint propagation on all binary clauses in the propositional logic component before performing Boolean constraint propagation on the non-binary clauses in the propositional logic component.

110. The computer software product of claim 105, wherein the configuration further comprises a configuration to determine if a non-binary clause becomes a binary clause because of a must-implication.

111. The computer software product of claim 110, wherein the clause comprises a field, the value of the field indicating if the clause is a binary or a non-binary clause.

112. The computer software product of claim 88, wherein the propositional logic component comprises binary and non-binary clauses, the configuration further comprising a configuration to perform conflict clause generation that distinguishes between binary and non-binary clauses.

113. The computer software product of claim 112, wherein the configuration further comprises a configuration to identify a candidate conflict clause and perform one-to-one substitutions on all literals within the identified conflict clause.

114. The computer software product of claim 112, wherein the configuration further comprises a configuration to:
   (a) identify a first conflict clause;
   (b) identify a first literal in the first conflict clause;
   (c) identify a second binary conflict clause, the second binary clause containing the negated first literal; and
   (d) replace a literal in the first conflict clause if a second literal within the second binary conflict clause has a state assignment before the first literal in the first binary conflict clause.

115. The computer software product of claim 114, wherein the configuration to perform (a) through (d) is performed before conflict clause minimization.

116. The computer software product of claim 114, wherein the configuration to perform (a) through (d) is performed after conflict clause minimization.

117. A computer software product comprising:
at least one of a non-transitory computer storage medium containing a set of processor executable instructions and a physical connection in electronic communication with a storage medium, supplying thereto the set of processor executable instructions that when executed by one or more processors within a computing apparatus, the computing apparatus comprising a memory and a plurality of processing elements, configure the computing apparatus to:
- define a parametric space of options available to each of the plurality of processing elements, the options related to a decision procedure;
- distribute to each of the plurality of processing elements a choice of instantiation, the choice of instantiation related to the options in the parametric space; and
- separately instantiate a subset of the options in the parametric space for each of the plurality of processing elements based on the choice of instantiation.

118. The computer software product of claim 117, wherein the decision procedure is a Boolean Satisfiability (SAT) solver.

119. The computer software product of claim 117, wherein the configuration further comprises a configuration to associate a plurality of keys each of the plurality representing one of the parametric space of options to an expression that can that can be evaluated to the choice of value for that option.

120. The computer software product of claim 119, wherein the configuration further comprises a configuration to evaluate the expression separately by each of the plurality of processing elements.

121. The computer software product of claim 119, wherein the expression is an arithmetic expression containing zero or more variables.

122. The computer software product of claim 121, wherein the expression is in postfix notation.

123. The computer software product of claim 117, wherein the expression contains variables whose interpretation in specific to the process being instantiated.

124. The computer software product of claim 123, wherein one of the variables is associated with a parameter selected from a group consisting of: a unique index of the process being instantiated, a value related to the number of processes being instantiated, a value related to the capabilities of the platform on which the process is being instantiated.

125. The computer software product of claim 124, wherein the configuration further comprises a configuration to store the association to a file accessible by each of the plurality of processing elements.

126. The computer software product of claim 119, wherein the arithmetic expression comprises support for an operation selected from a group consisting of: a modulus operation, an if-then conditional operation and an if-then-else conditional operation.

127. The computer software product of claim 117, wherein the parametric space comprises a parameter selected from a group consisting of: a seed to a random number generator; a parameter related to a choice of tactics used by the decision procedure; a parameter related to options affecting the behavior of the decision procedure within a tactic, a parameter related to options affecting the frequency of functions called within a tactic.

128. The computer software product of claim 117, wherein the configuration to distribute choices of instantiation comprises a configuration to distribute all possible combinations of choices of instantiation to the plurality of processing elements.

129. The computer software product of claim 117, wherein the configuration further comprising a configuration to specify a parametric space of options that can be explored dynamically by at least one processing element during execution.

* * * * *

UNITED STATES PATENT AND TRADEMARK OFFICE
CERTIFICATE OF CORRECTION

PATENT NO. : 8,688,619 B1
APPLICATION NO. : 12/719750
DATED : April 1, 2014
INVENTOR(S) : James Ezick et al.

Page 1 of 1

It is certified that error appears in the above-identified patent and that said Letters Patent is hereby corrected as shown below:

In the Specification

At Column 1, Line 15, under the heading "GOVERNMENT INTERESTS", should read:
-- This invention was made with government support under Contract No. W31P4Q-05-C-R171 awarded by the U.S. Army Aviation & Missile Command/DARPA. The government has certain rights in the invention. --

Signed and Sealed this
Twenty-first Day of June, 2022

Katherine Kelly Vidal
*Director of the United States Patent and Trademark Office*